(12) United States Patent
Furukawa et al.

(10) Patent No.: US 6,277,543 B1
(45) Date of Patent: Aug. 21, 2001

(54) METHOD FOR FORMING FEATURES USING FREQUENCY DOUBLING HYBRID RESIST AND DEVICE FORMED THEREBY

(75) Inventors: Toshiharu Furukawa, Essex Junction; Mark C. Hakey; Steven J. Holmes, both of Milton; David V. Horak, Essex Junction; Paul A. Rabidoux, Winooski, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/369,412

(22) Filed: Aug. 5, 1999

Related U.S. Application Data

(62) Division of application No. 08/959,779, filed on Oct. 29, 1997, now Pat. No. 6,007,988.

(51) Int. Cl.$^7$ .................................................. G03C 5/00
(52) U.S. Cl. ........................ 430/311; 430/312; 430/313; 430/314; 430/320; 430/329
(58) Field of Search ................................... 430/311, 312, 430/313, 314, 316, 320, 329

(56) References Cited

U.S. PATENT DOCUMENTS

| | | | |
|---|---|---|---|
| 4,104,070 | 8/1978 | Moritz et al. ............................... 96/36 |
| 4,377,633 | 3/1983 | Abrahanovich et al. ............. 430/312 |
| 4,767,723 | 8/1988 | Hinsberg, III et al. ................. 437/41 |
| 4,997,746 | 3/1991 | Greco et al. .......................... 430/314 |
| 5,087,847 | 2/1992 | Taylor et al. .......................... 430/169 |
| 5,213,916 | 5/1993 | Cronin et al. .............................. 430/5 |
| 5,214,603 | 5/1993 | Dhong et al. ......................... 365/207 |
| 5,286,584 | 2/1994 | Gemmink et al. ........................ 430/5 |
| 5,308,741 | 5/1994 | Kemp ..................................... 430/312 |
| 5,334,467 | 8/1994 | Cronin et al. .............................. 430/5 |
| 5,336,629 | 8/1994 | Dhong et al. ........................... 437/52 |
| 5,424,154 | 6/1995 | Borodovsky .............................. 430/5 |
| 5,429,896 | 7/1995 | Hasegawa et al. ....................... 430/5 |
| 5,472,814 | 12/1995 | Lin ........................................... 430/5 |
| 5,501,926 | 3/1996 | Cheng et al. ............................. 430/5 |
| 5,508,803 | 4/1996 | Hibbs et al. .......................... 356/243 |
| 5,529,944 | 6/1996 | Rajeevakumar ....................... 437/52 |
| 5,776,660 | * | 7/1998 | Hackey ................................ 430/296 |

OTHER PUBLICATIONS

Ito, H. and Maekawa, Y., IBM Technical Disclosure Bulletin, vol. 36, No. 8, pp. 335–336, Aug. 1993.

* cited by examiner

*Primary Examiner*—Thorl Chea
(74) *Attorney, Agent, or Firm*—Schmeiser, Olsen & Watts; Mark F. Chadurjian

(57) ABSTRACT

The preferred embodiment of the present invention overcomes the limitations of the prior art by providing a method to form unlinked features using hybrid resist. The method uses a trim process in order to trim the linking features from the "loops" formed by the hybrid resist. This allows the method to form a plurality of unlinked features rather than the loops. In order to trim the ends, a relatively larger trim area is formed adjacent the narrow feature line, either by a second exposure step or by utilizing a grey scale reticle. The broader or wider open area allows features to be formed in the narrow feature lines and being trimmed from the relatively large areas, thereby resulting in district features rather than loops.

4 Claims, 40 Drawing Sheets

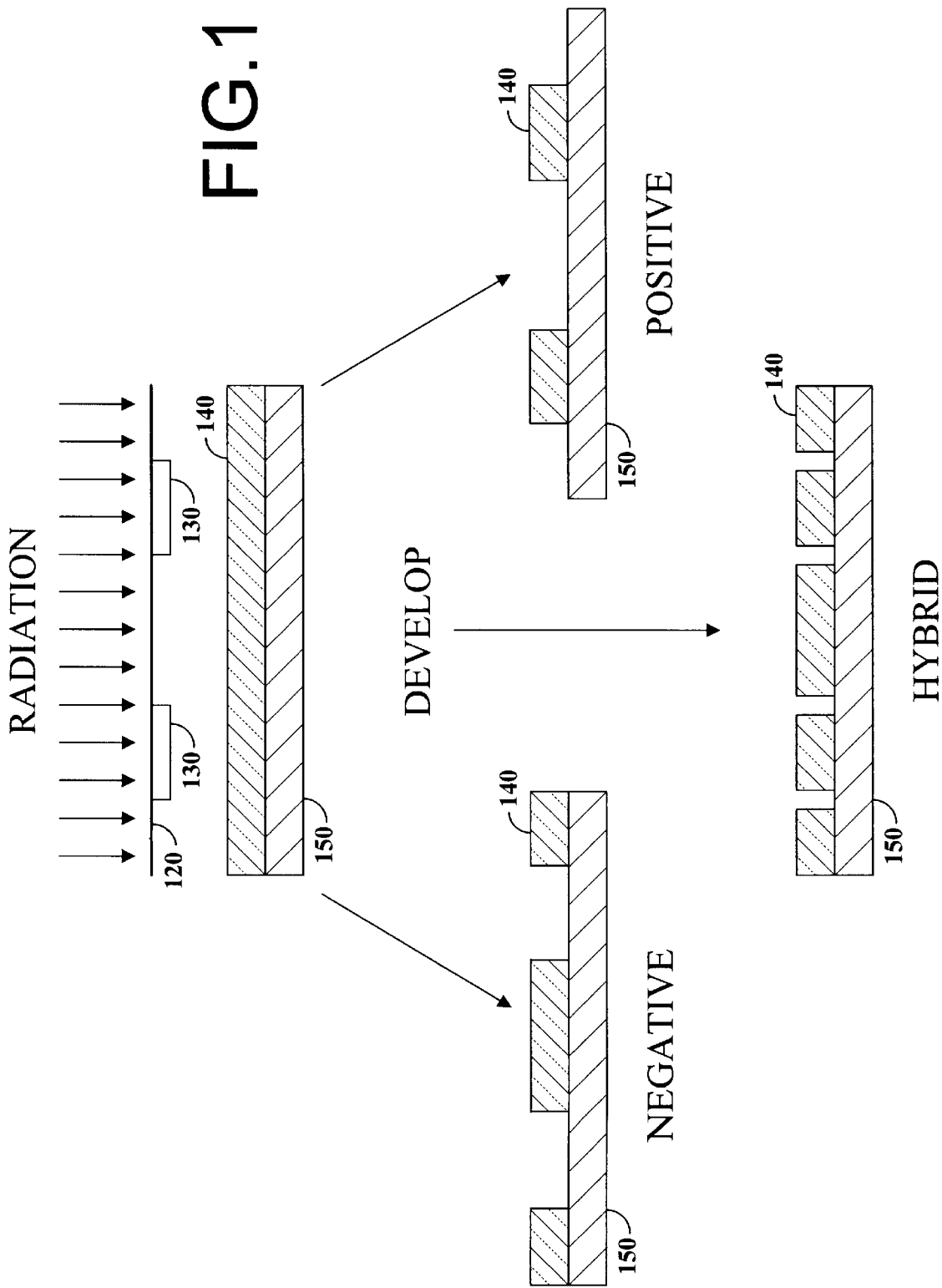

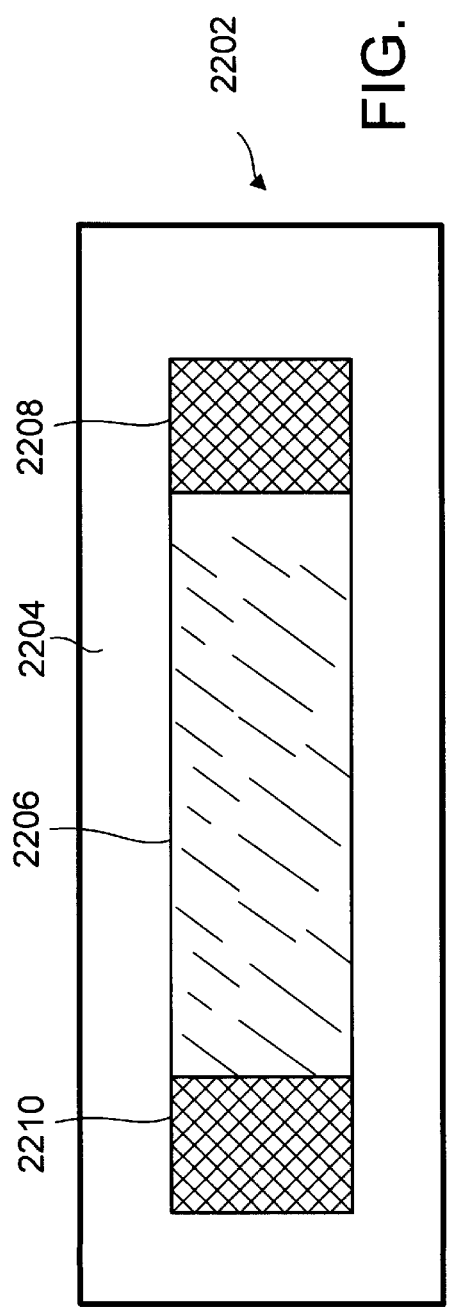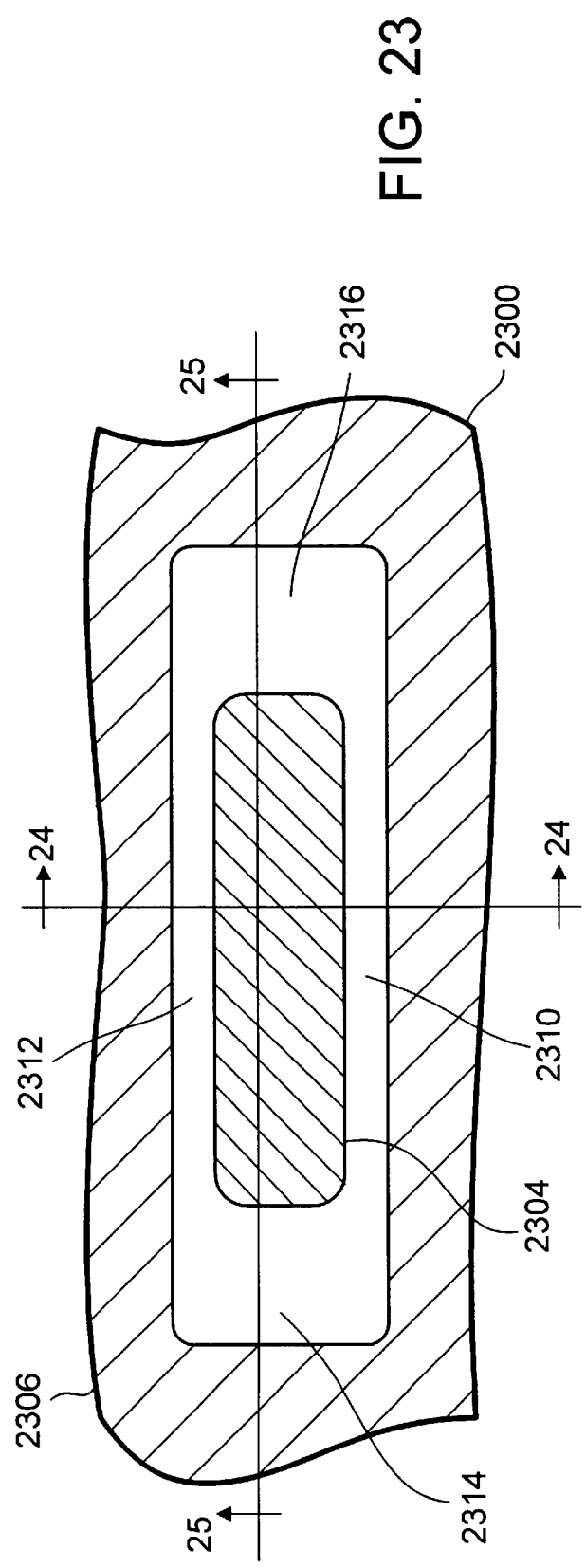

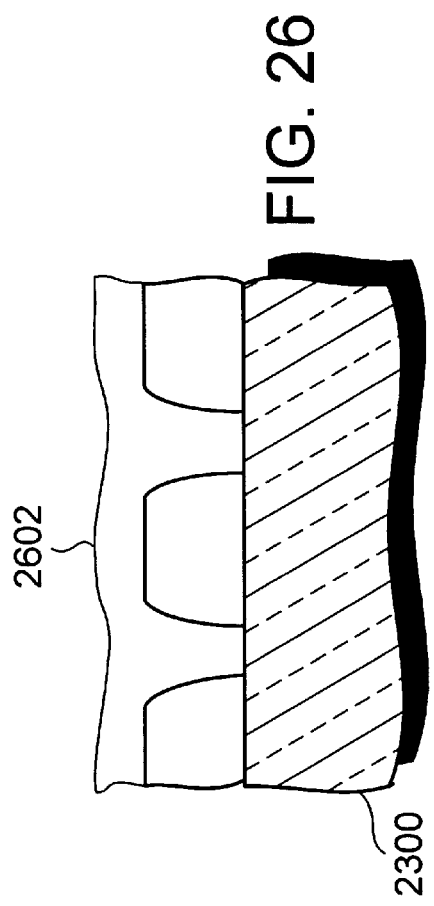
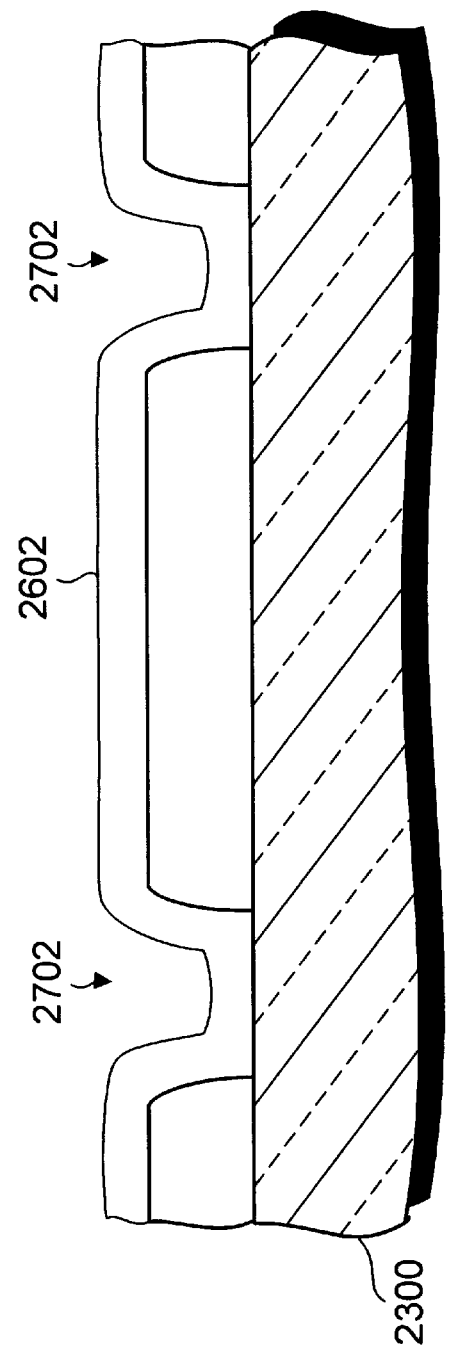

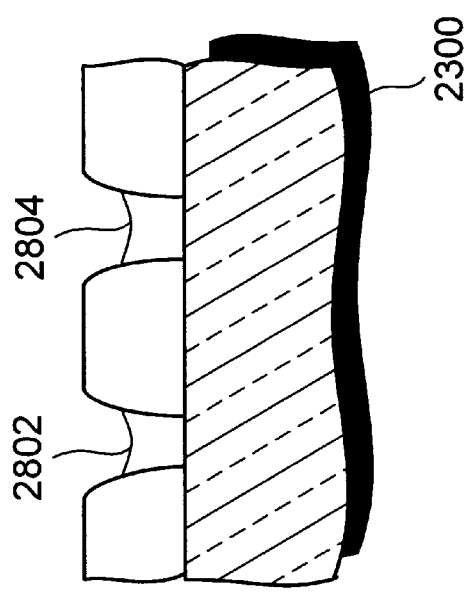
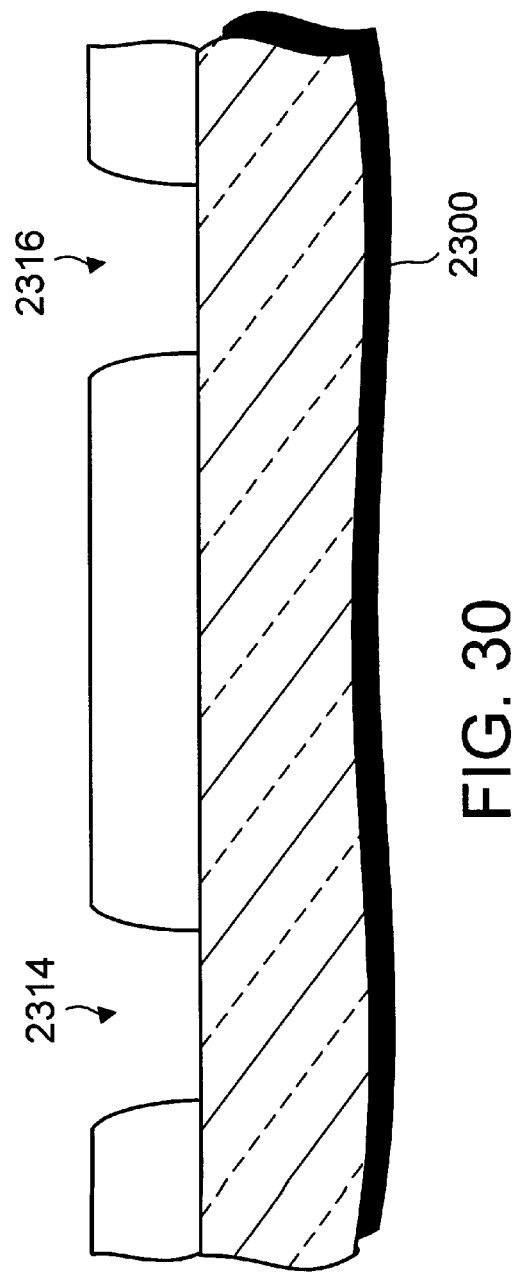

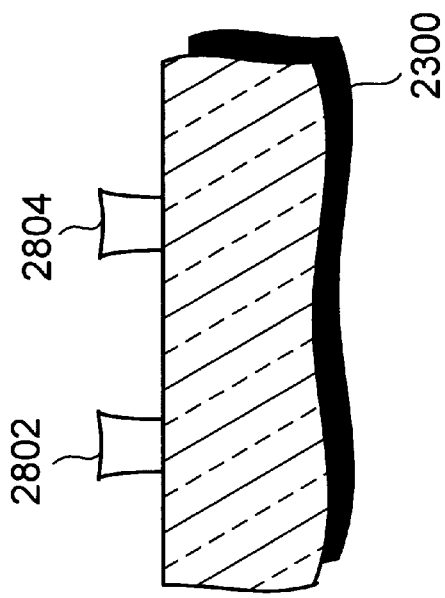
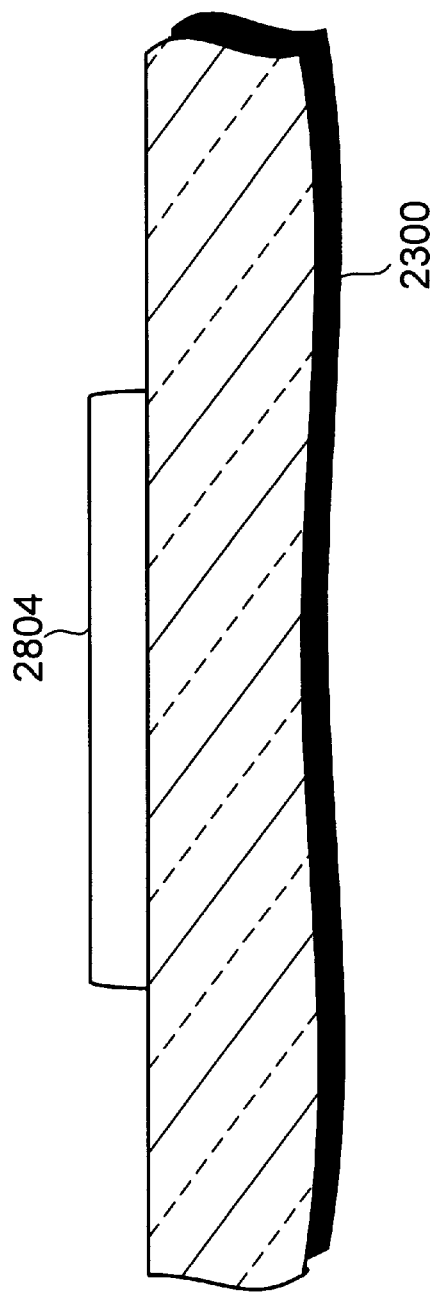

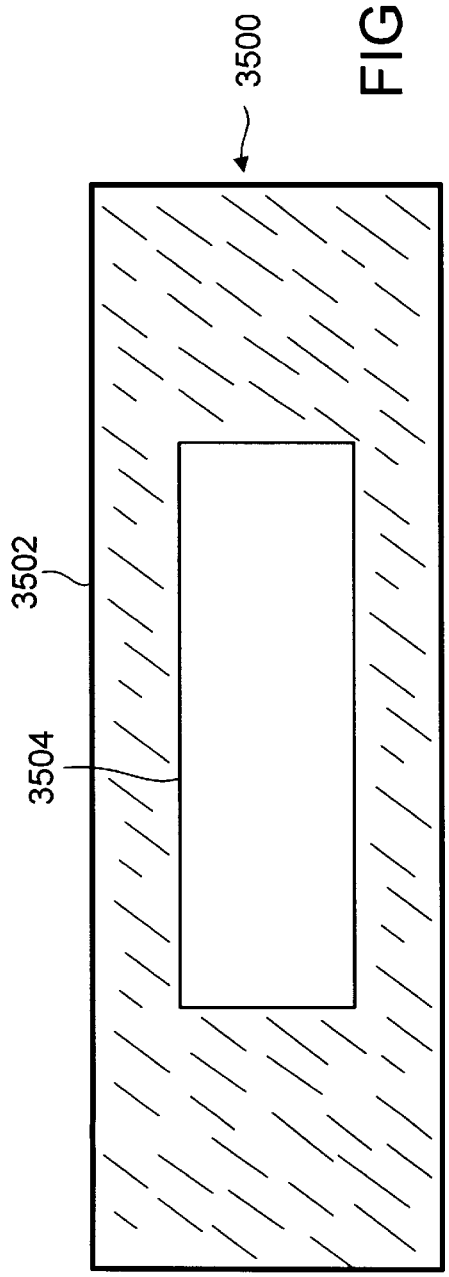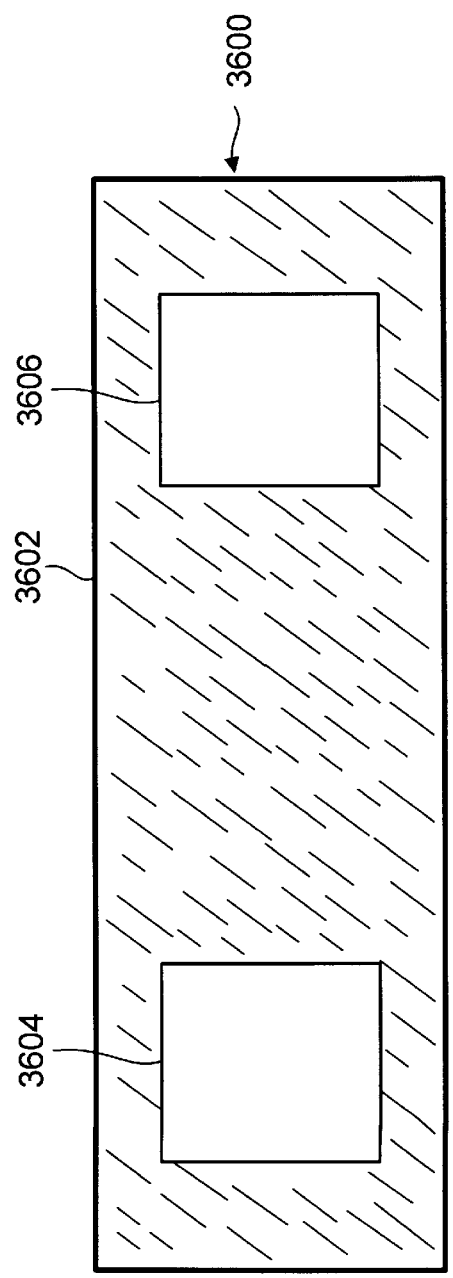

METHOD FOR FORMING FEATURES USING FREQUENCY DOUBLING HYBRID RESIST AND DEVICE FORMED THEREBY

This application is a division of Ser. No. 08/959,779 Oct. 29, 1997 U.S. Pat. No. 6,007,988.

RELATED APPLICATIONS

This application is related to the following co-pending U.S. patent applications, Ser. No. 08/715,288, for "Low 'K' Factor Hybrid Photoresist," and Ser. No. 08/715,287, for "Frequency Doubling Photoresist," both filed Sep. 16, 1996.

BACKGROUND OF THE INVENTION

1. Technical Field

The present invention relates generally to the field of semi-conductor manufacturing and, more specifically, to a method, when using a frequency doubling resist material to form sub-lithographic features, of trimming the ends of the printed features.

2. Background Art

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes.

Photolithography, a type of lithographic process, is used in the manufacturing of semiconductor devices, integrated optics, and photomasks. The process basically comprises: applying a layer of a material that will react when exposed to light, known as a photoresist or, simply, a resist; selectively exposing portions of the photoresist to light or other ionizing radiation, i.e., ultraviolet, electron beams, X-rays, etc., thereby changing the solubility of portions of the material; and developing the resist by washing it with a basic developer solution, such as tetramethylammonium hydroxide (TMAH), thereby removing the non-irradiated (in a negative resist) or irradiated (in a positive resist) portions of the layer.

Conventional positive and negative tone photoresists are characterized by a dissolution curve in which there is a single transition from a first dissolution rate to a second dissolution rate as the resist is exposed to varying levels of actinic radiation. In a positive resist, the initially unexposed resist is insoluble in developer, while the exposed resist becomes more soluble as the exposure dose is increased above a threshold value. For a negative resist, similar behavior is observed, except that the initially unexposed resist is soluble in developer, and the exposed area is rendered insoluble. By means of this differential solubility between the exposed and unexposed resist areas, it is possible to form a pattern in the resist film. This pattern can be used to form integrated circuit devices, and is currently a critical component in their manufacture.

In an ideal situation, the exposure tool would only allow the radiation to hit the resist material in the areas of the mask that are clear, thus providing sharp edges for the lines and spaces. However, diffraction patterns are formed at the edges of the clear areas, resulting in partial exposure of the resist in those areas. Certain patents have taken advantage of this phenomenon, such as U.S. Pat. No. 4,568,631 issued to Badami et al. on Feb. 4, 1986 and assigned to the assignee of record for the present invention, which discloses utilizing a positive resist and an additive for image reversal in order to create thin resist lines only in the areas where light intensity has been reduced by diffraction effects. However, this procedure uses a resist with conventional positive and negative tone dissolution responses and requires two separate expose and develop operations to form a resist image from the edge of a reticle image.

It is desirable, therefore, to devise new mechanisms of resist response such that conventional optical lithography can be extended to smaller feature sizes without developing new tools and reticles. Additionally, as these new tools and reticles are eventually developed and implemented, these new resist approaches would remain applicable as a further extension of lithographic capability.

Previously, a new frequency doubling hybrid photoresist was developed to extend photolithography to a smaller feature size. The hybrid resist uses the edges of the mask shapes to define the feature spaces in the resist. However, because the edge of the mask shape continues around the entire perimeter of the shape, these edge defined spaces are all linked together. Thus, features created using hybrid resist are "linked" together. While this linking is acceptable in some situations, such as in the formation of shallow trench isolations, the linking can be unacceptable in other situations where the linking can cause unwanted shorting.

DISCLOSURE OF INVENTION

Accordingly, the present invention provides a photoresist material having, simultaneously, both a positive tone and a negative tone response to exposure. This combination of materials can provide a new type of resist, which we call a hybrid resist.

Additionally, the present invention provides a method for forming unlinked features using hybrid resist. The method uses a trim process in order to trim the linking features from the "loops" formed by the hybrid resist. This allows the method to form a plurality of unlinked features rather than the loops. In order to trim the ends, a relatively larger trim area is formed adjacent the narrow feature line, either by a second exposure step or by utilizing a grey scale reticle.

The present invention can be used in a wide variety of applications to provide a wide variety of features. For example, the present invention can be used to form a Dynamic Random Access Memory (DRAM) cell that requires 4 SQ of spaces rather than the usual 8 SQ by forming portions of the DRAM using hybrid resist and the trim process of the present invention.

Still another feature of the present invention is that isolation trench areas may be accurately printed using the hybrid resist and a grey scale reticle in a single exposure step rather than two exposure steps.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

FIG. 22 is a schematic view of an exemplary mask portion in accordance with the first embodiment;

FIG. 23 is a top schematic view of a wafer portion with patterned hybrid resist upon it in accordance with the first embodiment;

FIG. 26 is a cross-sectional side view of the wafer portion of FIG. 23 taken along line 24—24 with feature material deposited;

FIG. 27 is a cross-sectional side view of the wafer portion of FIG. 23 taken along line 25—25 with feature material deposited;

FIG. 29 is a cross-sectional side view of the wafer portion of FIG. 28 taken along line 29—29;

FIG. 30 is a cross-sectional side view of the wafer portion of FIG. 28 taken along line 30—30;

FIG. 32 is a cross-sectional side view of the wafer portion of FIG. 31 taken along line 32—32;

FIG. 33 is a cross-sectional side view of the wafer portion of FIG. 31 taken along line 33—33;

FIG. 35 is a schematic view of a first mask portion in accordance with the second embodiment;

FIG. 36 is a schematic view of a second mask portion in accordance with the second embodiment;

BEST MODE FOR CARRYING OUT THE INVENTION

Figure 3:
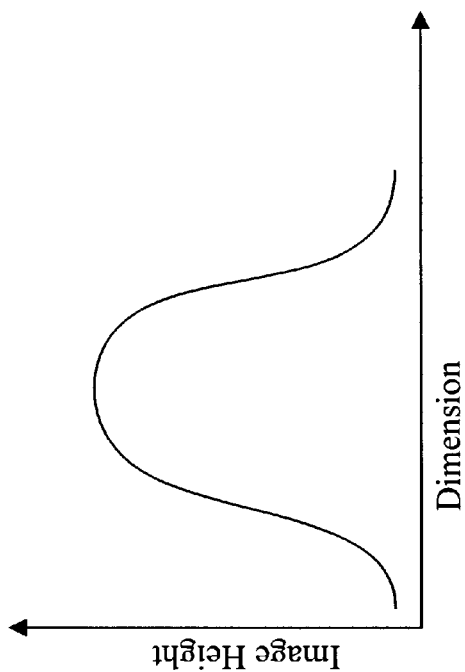
FIG. 3 is a graph illustrating the line pattern for positive resist printed with a reticle line pattern.

A description of hybrid photoresist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 μm and less can be printed with current deep ultra violet (DUV) lithography tools that are designed for operation at 0.35 μm resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2, μm feature with conventional resist generally requires a 0.2 μm reticle image size. With hybrid resist, a 0.2 μm space can be formed with a single edge of a reticle feature; for example, a 0.5, μm reticle opening could produce two 0.2, μm spaces and a 0.2 μm line. In this way, one could accomplish 'reduction' x-ray or E-beam lithography; the reticle image pitch could be approximately 2x the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1x reticle, i.e., a reticle that normally has a one-to-one relationship with the image printed on the substrate, because variations in the image size on the reticle are normally reproduced on the substrate.

Figure 2:
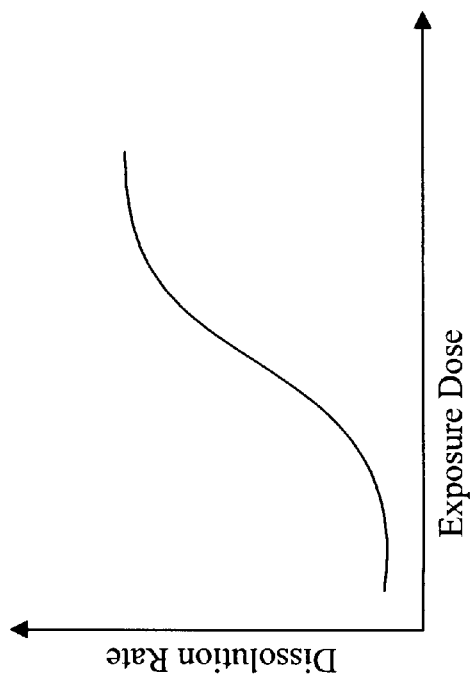
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
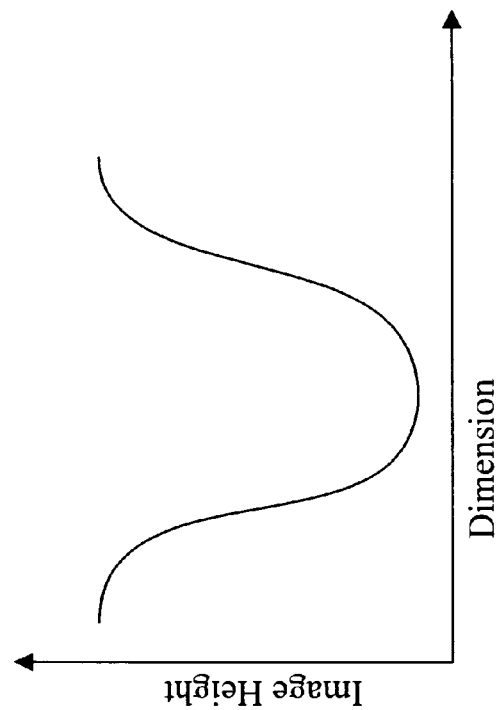
FIG. 5 is a graph illustrating the line pattern for negative resist printed with a reticle line pattern.
Figure 4:
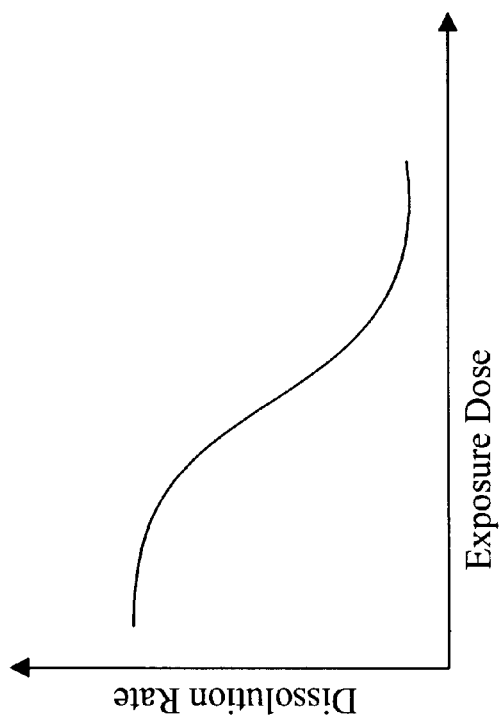
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
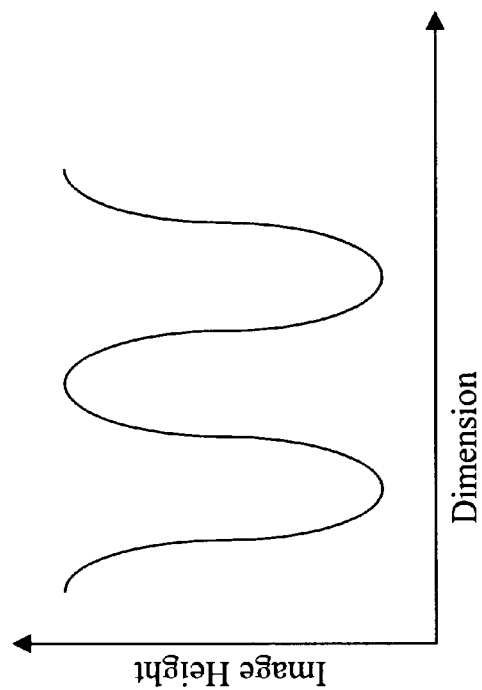
FIG. 7 is a graph illustrating the space/line/space pattern formed onto a substrate using hybrid resist.
Figure 6:
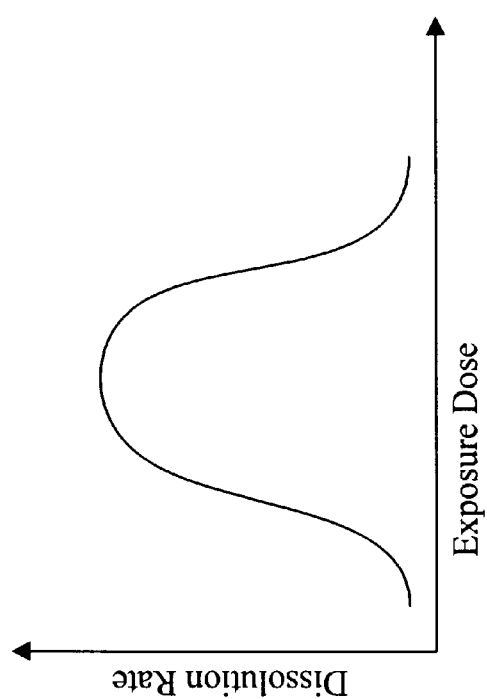
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
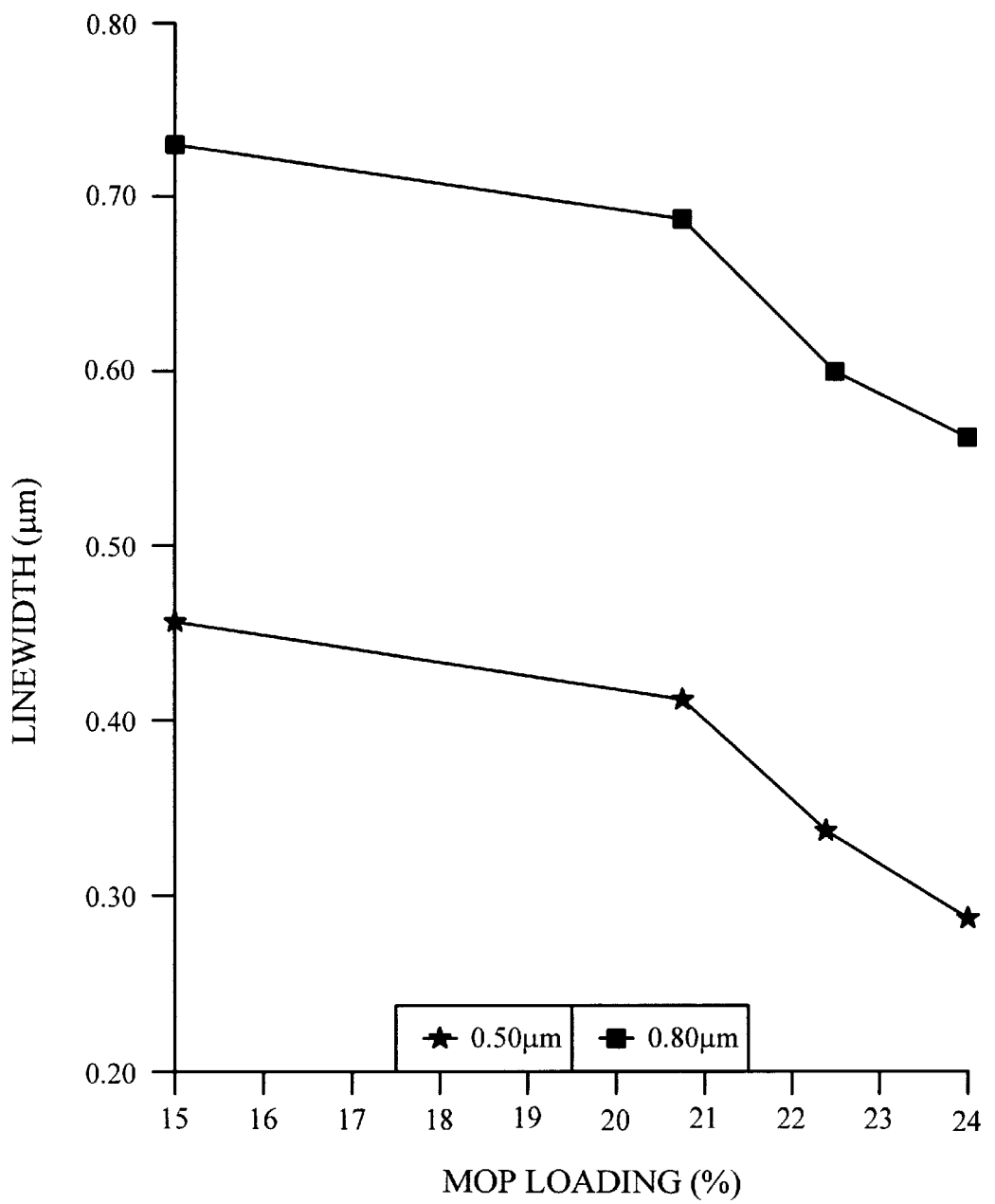
FIG. 10 is a graph showing the linewidth in nm plotted against the amount of positive tone solubility inhibitor (MOP) incorporated in a hybrid resist of the present invention.
Figure 15:
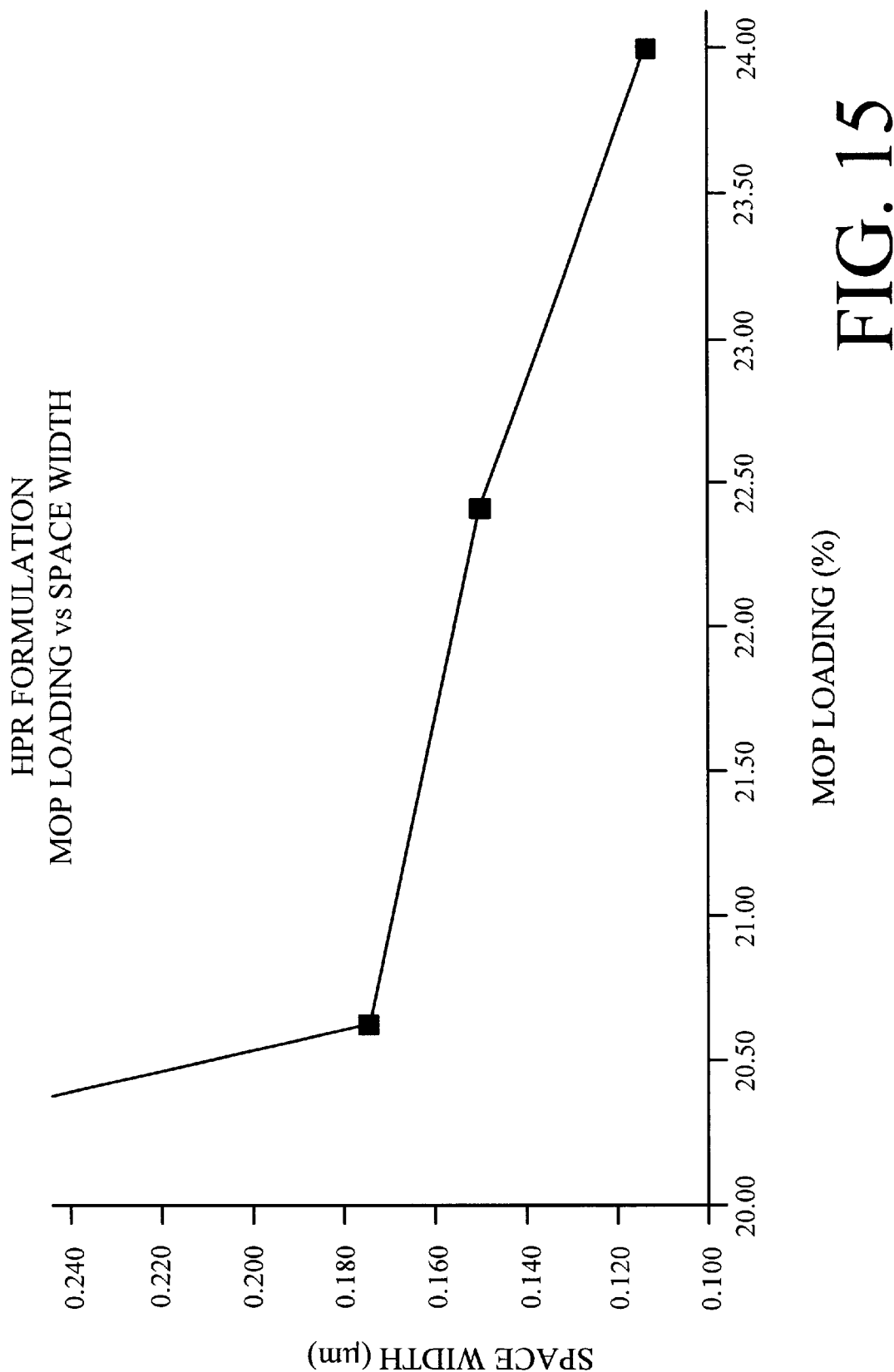
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
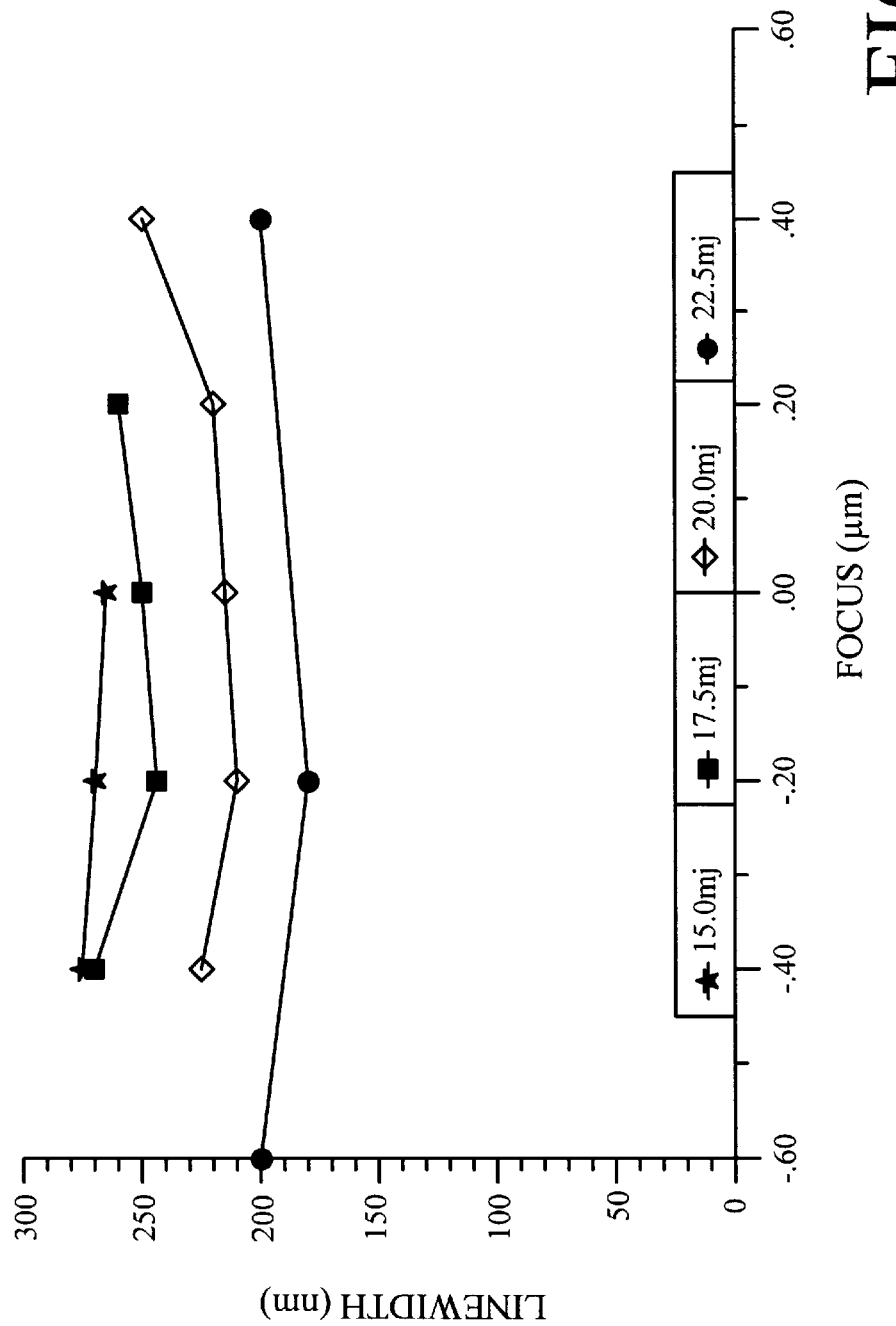
FIG. 8 is a graph of linewidth in nanometers (nm) plotted against focus in microns ($\mu$m) of a formulation of a standard negative resist at various exposure energies.
Figure 9:
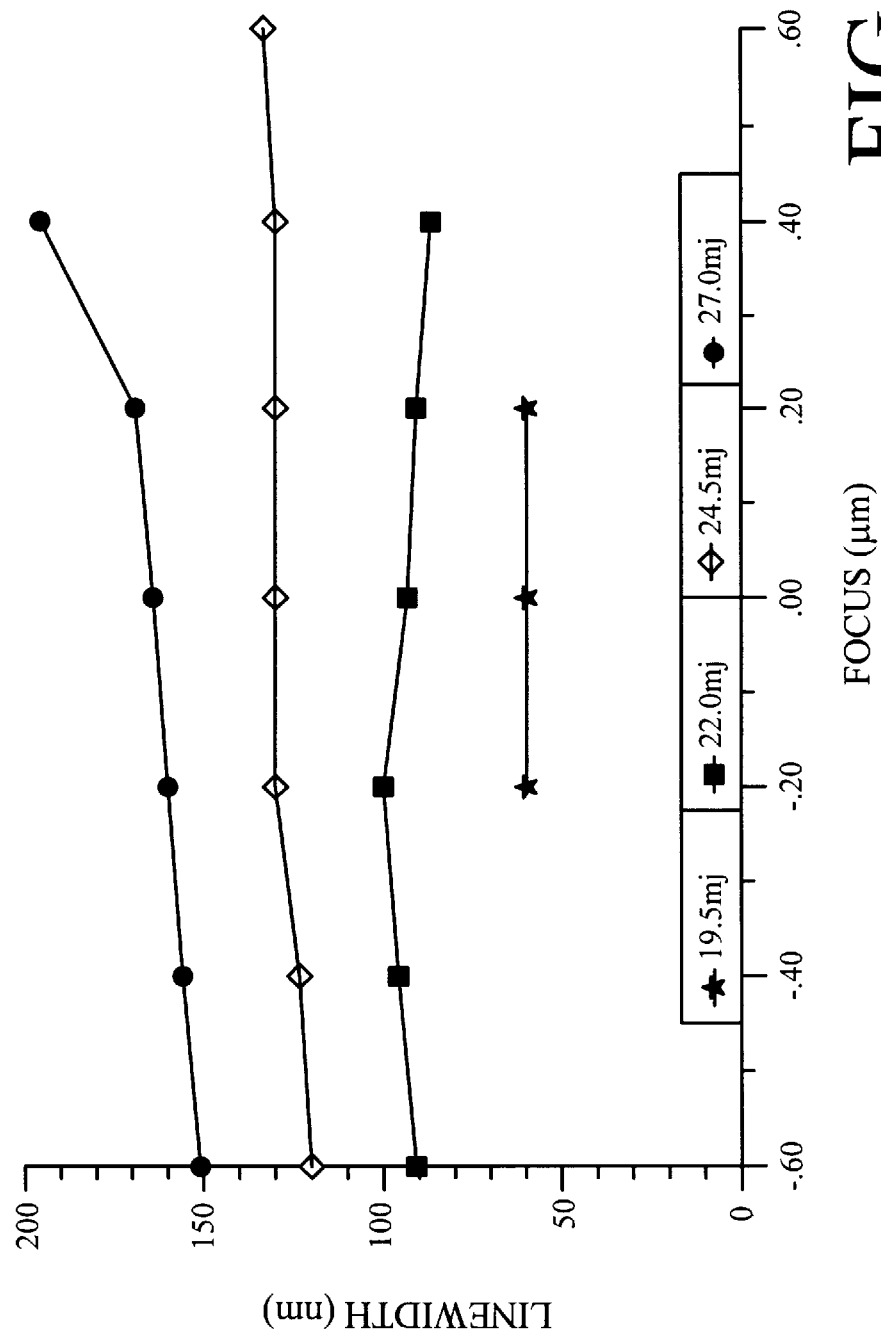
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
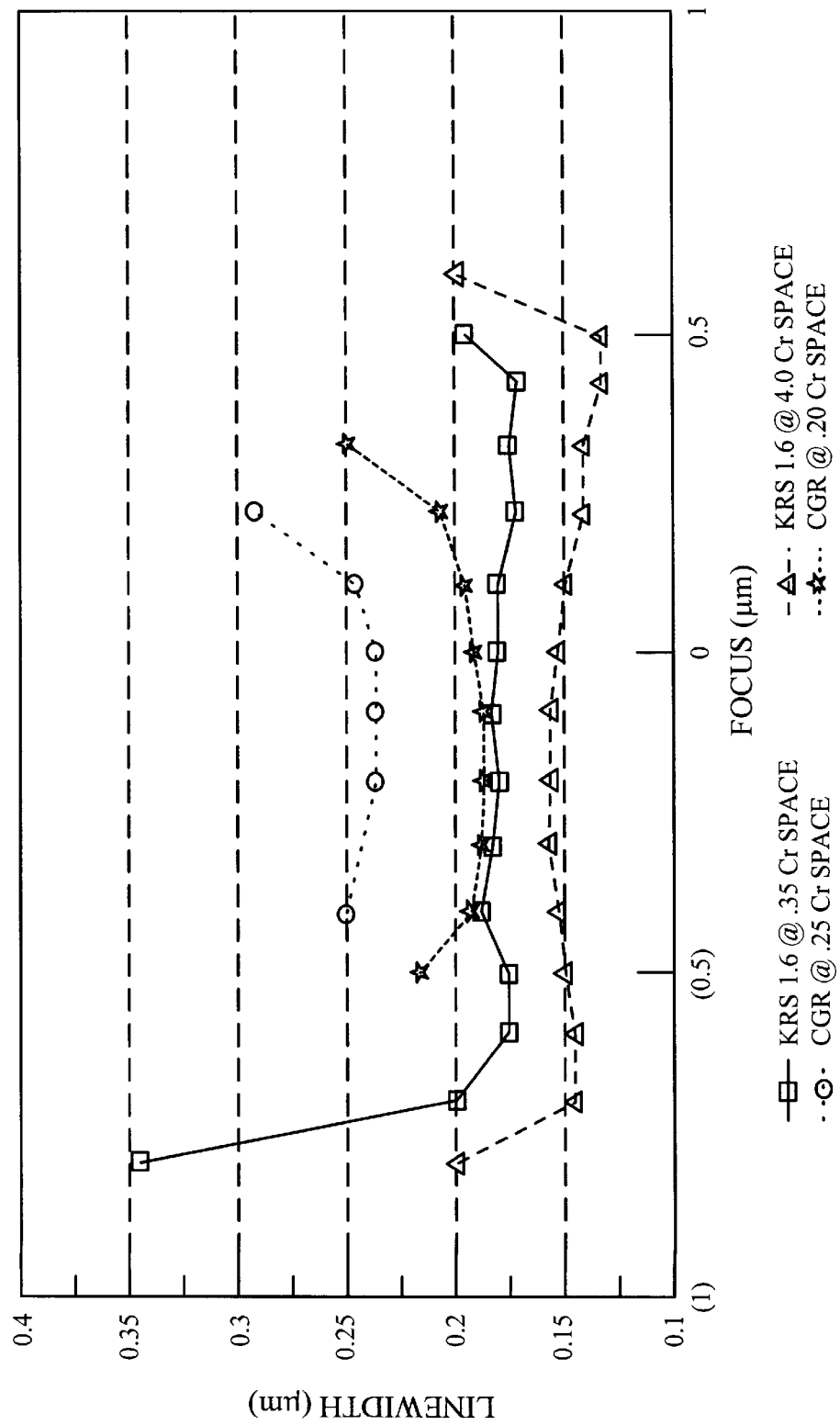
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 µm larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydride copolymers, polyhydroxystyrene-p-tertiarybutyl-carganatostyrene co-polymers, poly(2-hydroxystyrene), phenol-formaldehyde resins, polymethyl methacrylate- tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

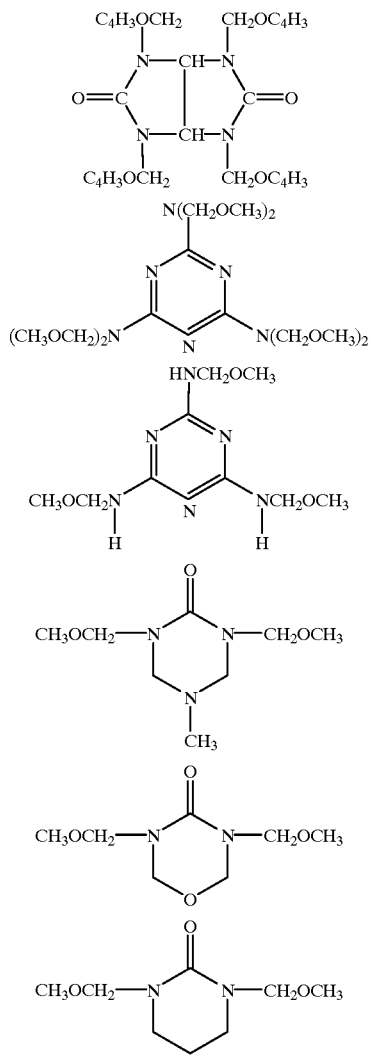

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/ butylated glycol-urils, for example of the formula:

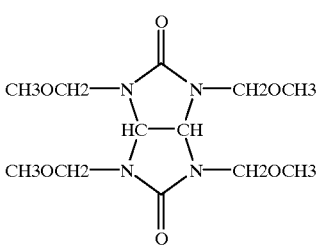

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolnonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3-dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

The solution was filtered through a 0.2 μm filter. The solution was coated onto silicon wafers primed with hexamethyl- disilazane with a soft bake of 110° Celsius (C) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative cross-linking chemistry becomes predominant and the dissolution rate falls back to a value close to zero.

Figure 13:
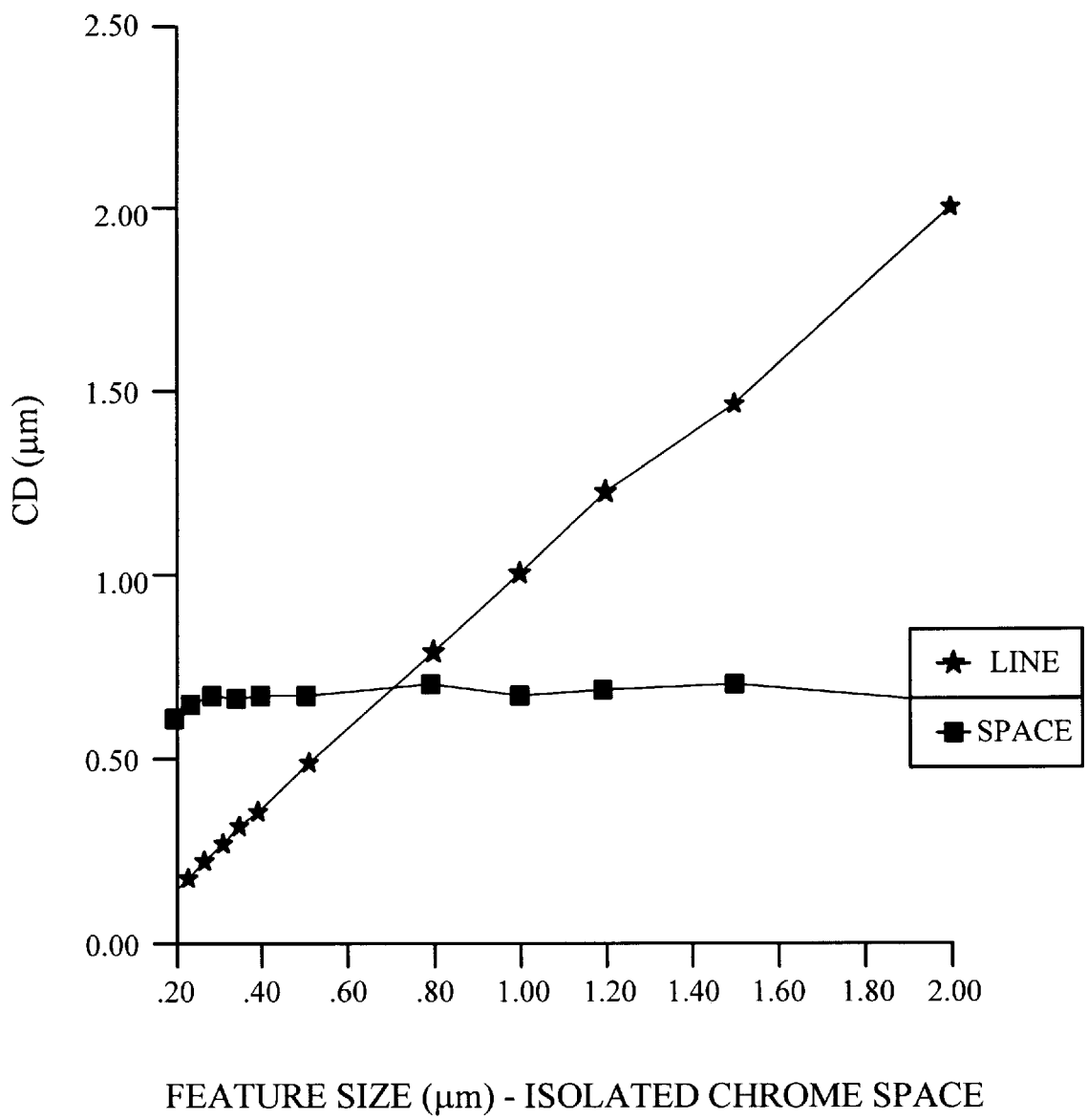
FIG. 13 is a graph showing the resultant line and space widths as functions of the chrome space width using one formulation of a hybrid resist of the present invention.

In another experiment with the same resist, when a MICRASCAN II 0.5 NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 12:
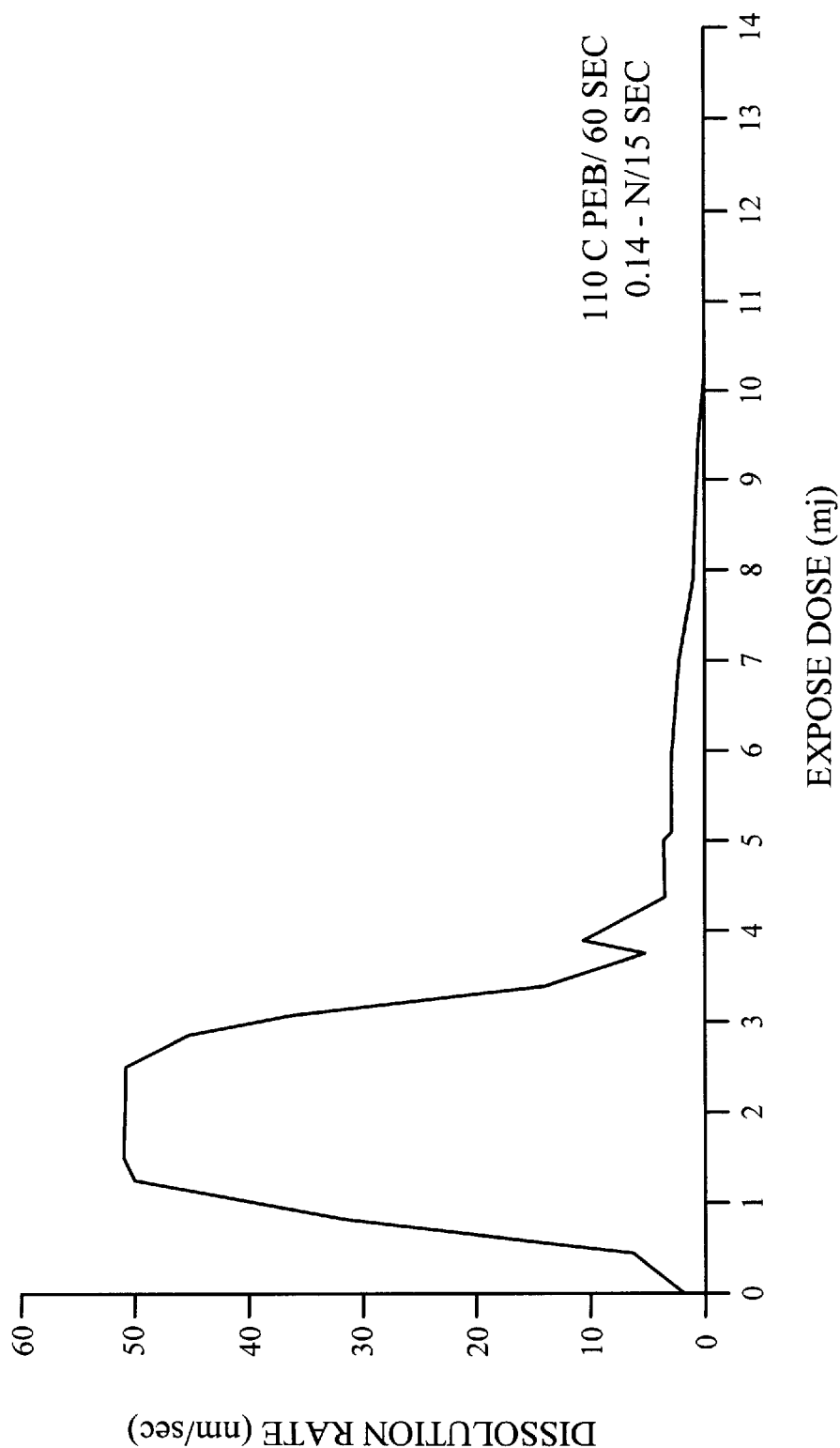
FIG. 12 is a graph showing the dissolution rate in nanometers per second (nm/sec) as a function of the exposure dose in milliJoules (mJ) using one formulation of a hybrid resist of the present invention.
Figure 14:
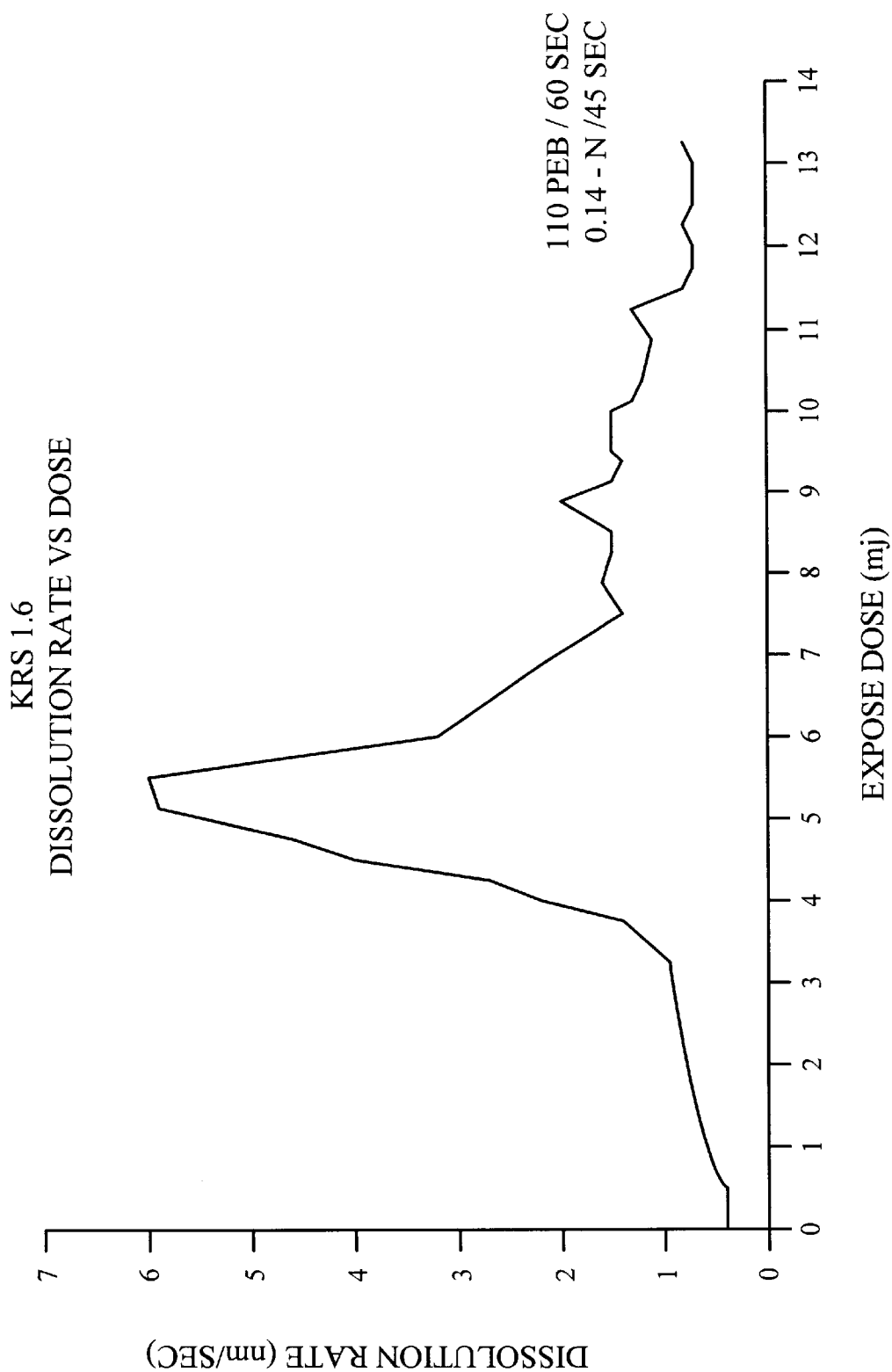
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
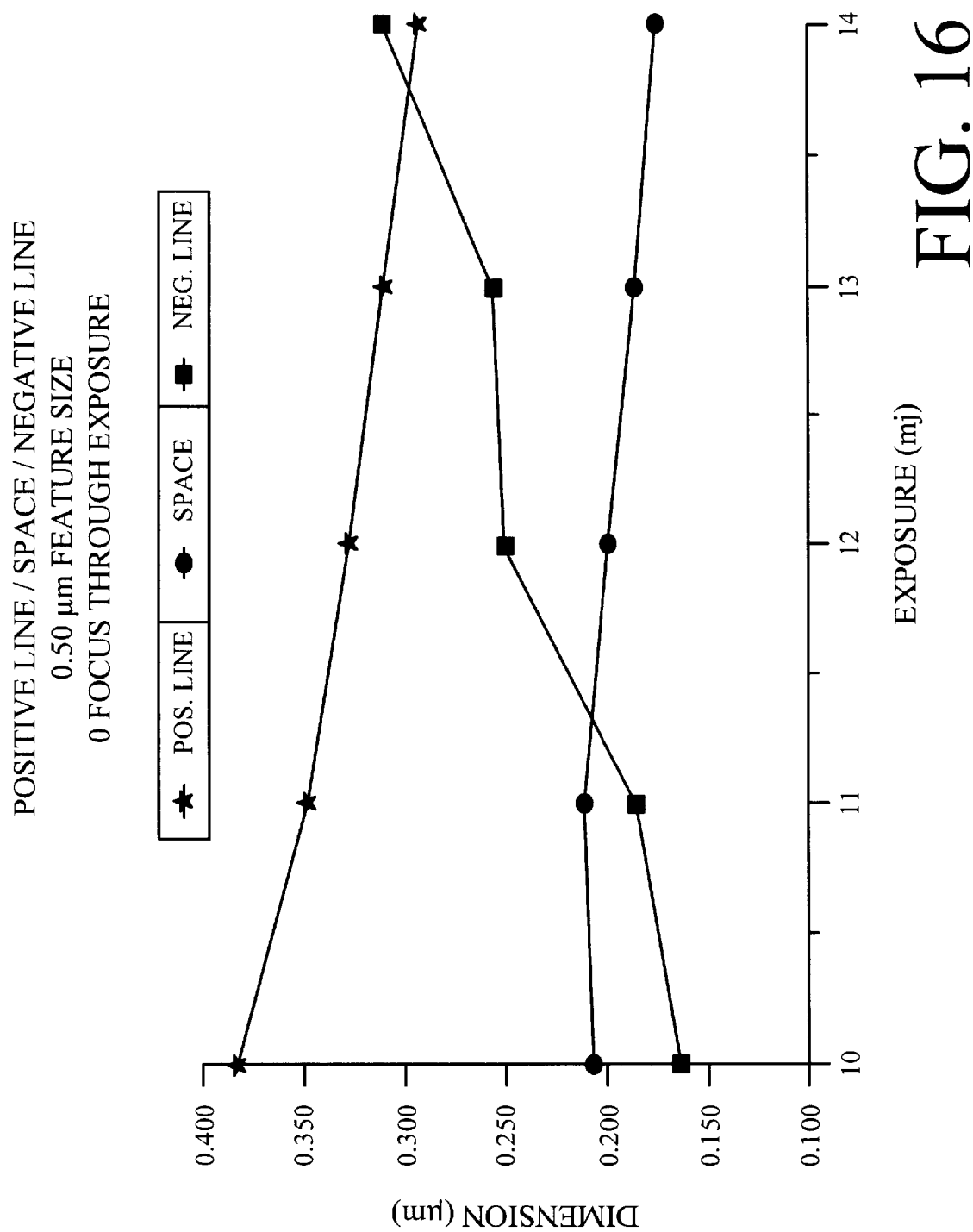
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of exposure. The space remains relatively constant in the range of about 0.18 $\mu$m, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m.

From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 $\mu$m was observed for the hybrid resist relative to the standard negative resist, as calculated using standard methods known in the art.

Preferred Embodiments

Thus, the unique properties of hybrid resist allows reduced feature size using traditional lithography techniques by using the edge of the mask shapes to define the feature spaces in the resist. However, because the edge of the mask shape continues around the entire perimeter of the shape, these edge defined spaces are all linked together. Thus, the same unique properties result in "linking" of the created features.

Figure 19:
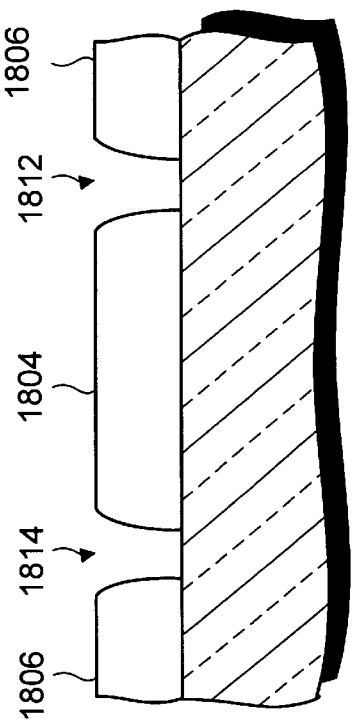
FIG. 19 is a cross-sectional side view of the wafer portion of FIG. 18 taken along line 19—19.
Figure 20:
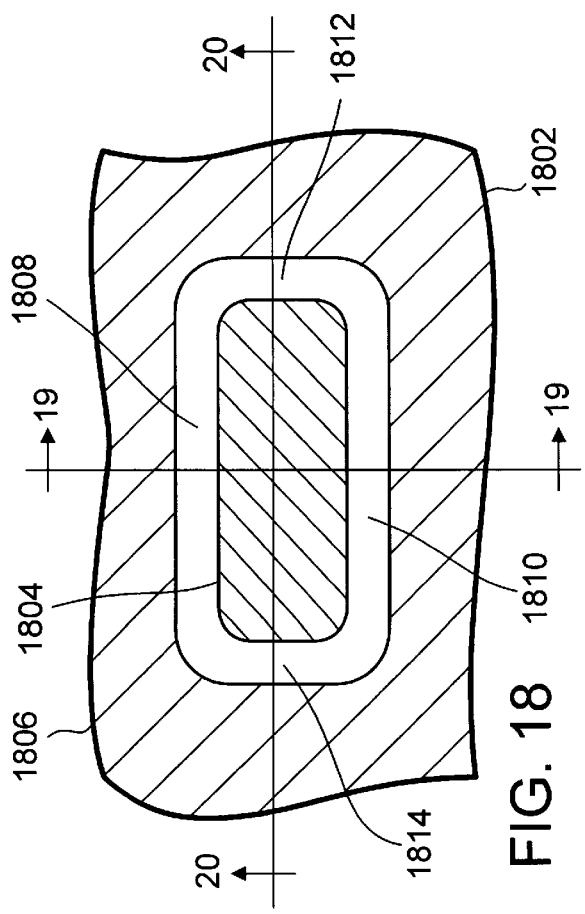
FIG. 20 is a cross-sectional side view of the wafer portion of FIG. 18 taken along line 20—20.
Figure 17:
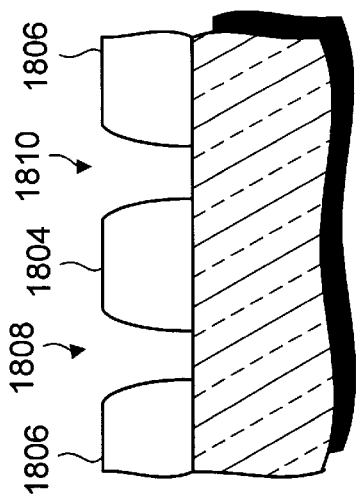
FIG. 17 is a schematic view of an exemplary mask portion.

In particular, the hybrid resist that is exposed to intermediate amounts of radiation becomes soluble. This occurs at the edges of the mask shapes, all around the perimeter of the mask shape. When developed, these regions wash away, and create a "linked spaces" in the hybrid resist. For example, turning to FIG. 17, a mask 1700 containing a mask blocking shape 1702 is illustrated. When hybrid resist is deposited on a wafer, exposed through mask 1700 with actinic radiation, and developed, the mask 1700 creates a linked pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
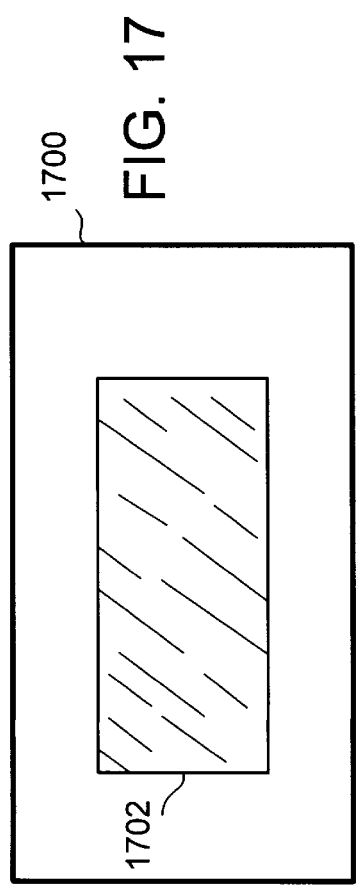
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain insoluble in the developer and form positive tone line patterns. Hybrid resist portions which are exposed with high intensity radiation (i.e., the outside region 1806 not blocked by mask shape 1702) form a negative tone line image. Hybrid resist portions which are exposed with intermediate amounts of intensity (i.e., the areas inside the edges of mask shape 1702) are dissolved during the development step and feature form spaces 1808 and 1810. This same process forms linking spaces 1812 and 1814 at the short edges of mask shape 1702, that linking spaces 1812 and 1814 together. (In this application, the term "feature space" is defined as any space created by exposing hybrid resist to intermediate amounts of radiation by which a feature is to be created. By contrast, the term "linking space" is defined as any space created by the same process where no feature is desired such that other "desired features" are not linked together.) The feature spaces 1808 and 1810 can be used form the desired features, for example, by depositing material in the spaces or by implanting into the wafer through the spaces. However, because of the linking spaces 1812 and 1814, these features will be connected together.

One advantage in using hybrid resist is that spaces 1808 and 1810 can be printed with a width of less than 0.2 $\mu$m with current deep ultra violet (DUV) lithography tools that are designed for operation at 0.35 $\mu$m resolution. Thus, by using the edge of a mask shape to define spaces in hybrid resist, smaller dimension features can be created than normal lithography allows. The linking of spaces 1808 and 1810, while desirable in some applications, such as isolation trench structures, is a problem for other types of features, such as gate conductors or wiring applications. For these applications the linking of spaces can result in unwanted shorting.

Figure 21:
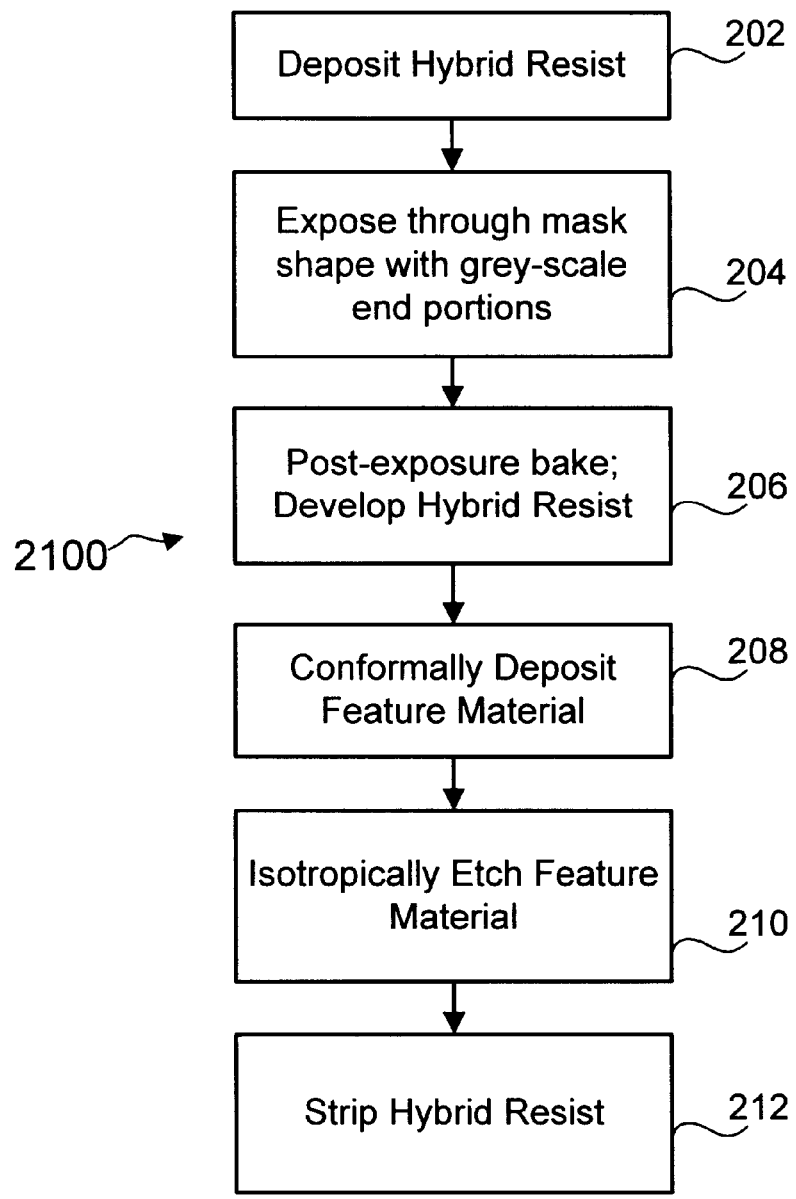
FIG. 21 is a flow diagram illustrating a first embodiment method.

The present invention provides several embodiments for eliminating the unwanted linking of features created using hybrid resist. Turning to FIG. 21, a preferred method 2100 for forming unlinked features on a semiconductor device is illustrated. The preferred methods can be used in a variety of processing situations, and thus can be used to create a variety of types of features that will be found in CMOS, bipolar, and other semiconductor devices. As such, the preferred methods can be used on semiconductor wafers of various types and in various stages of the fabrication process.

The first step 202 is deposit hybrid resist on the semiconductor wafer. The next step 204 is to expose the hybrid resist to actinic radiation through a mask that contains grey-scale end portions at least one of the ends of the mask shape.

The next step 206 is to perform a post exposure bake and develop the exposed hybrid resist. The post exposure bake can be used to trigger the hybrid response in the hybrid resist, allowing regions of hybrid resist that have been exposed with intermediate amounts of intensity to be developed away. The post exposure bake also causes the negative tone areas to become fully cross linked and immune to development. Thus, hybrid resist portions which are unexposed (i.e., the areas under the blocking mask shape) remain insoluble in the developer and form positive tone line patterns. Hybrid resist portions which are exposed with high intensity radiation (i.e., the areas not under a mask shape) form a negative tone line image. Hybrid resist portions which are exposed with intermediate amounts of intensity (i.e., the areas under the edges of the blocking portion of the mask shape and the areas under the grey-scale end portions of the mask shape) are dissolved during the development step.

Turning to FIG. 22, an exemplary mask portion 2202 is suitable for use in the preferred embodiment in step 204 is illustrated. The mask portion 2202 includes a transparent portion 2204 around the exterior mask portion 2202. The mask portion 2202 also includes a blocking portion 2206 (i.e., a portion that is not transparent to the used actinic radiation.) Additionally, in accordance with the preferred embodiment, the mask portion 2202 includes two grey-scale portions 2208 and 2210. The grey scale portions 2208 and 2210 will be used to "trim" the linking features that would otherwise cause shorting between features.

Figure 24:
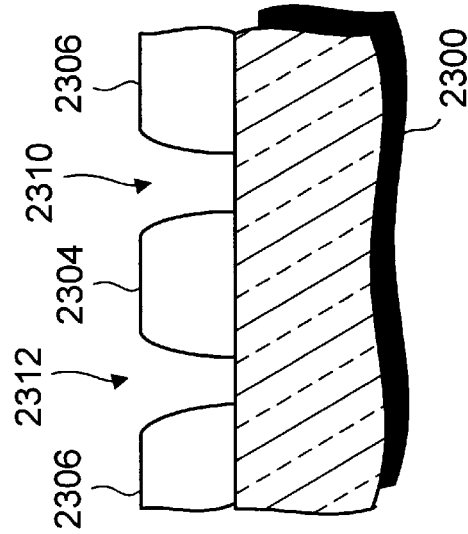
FIG. 24 is a cross-sectional side view of the wafer portion of FIG. 23 taken along line 24—24.
Figure 25:
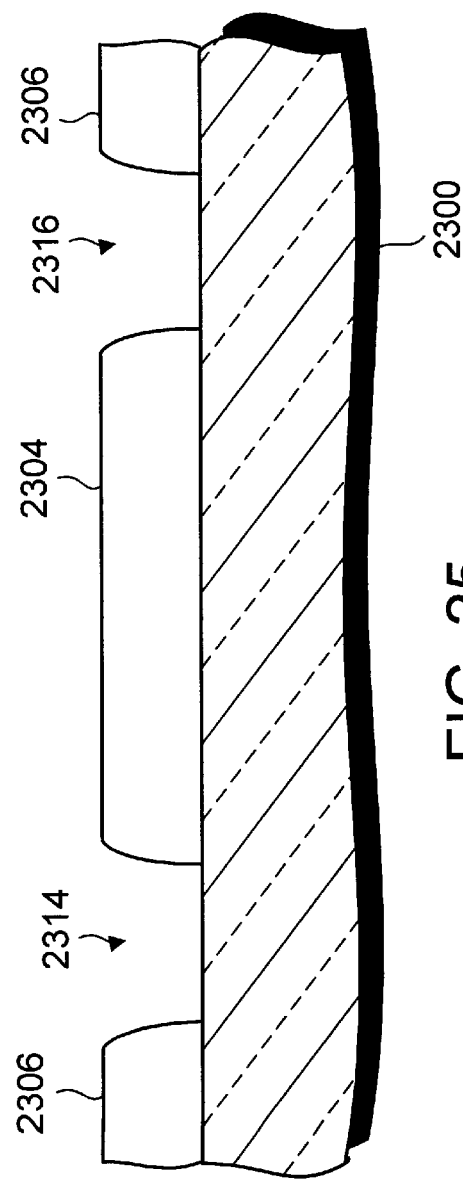
FIG. 25 is a cross-sectional side view of the wafer portion of FIG. 23 taken along line 25—25.

Turning to FIG. 23, a wafer portion 2300 with hybrid resist that has been deposited, exposed through the mask 2202 and developed is illustrated. The wafer portion 2300 is also illustrated in FIG. 24, a cross sectional view taken along line 24—24 in FIG. 23, and in FIG. 25, a cross sectional view taken along line 25—25 in FIG. 23. Hybrid resist portions which are unexposed (i.e., the inside region 2304 blocked by mask shape 2206) remain insoluble in the developer and form positive tone line patterns. Hybrid resist portions which are exposed with high intensity radiation (i.e., the outside region 2306 not blocked by mask shape 2206) form a negative tone line image. Hybrid resist portions which are exposed with intermediate amounts of intensity (i.e., the areas inside the edges of blocking mask shape 2206 and the areas under grey-scale mask portions 2208 and 2210) are dissolved during the development step. This forms the feature spaces 2310 and 2312 in the resist around the edges of the blocking mask shapes 2206, and forms a trim spaces 2314 and 2316 in the hybrid resist under the grey-scale mask shapes 2208 and 2210.

The feature spaces 2310 and 2312 preferably take advantage of the hybrid resist properties to have a sub-critical width dimension. Conversely, the trim spaces 2314 and 2316 have proportionally larger dimensions, wide enough such that gaps 2702 are formed in the spaces between the "sidewalls" of feature material. Because the gaps 2702 are not filled, the maximum thickness of the feature material is that of the deposition thickness, while the trim spaces are completely filled and thickness feature material there is relatively larger. The dimensions of the trim spaces 2314 and 2316 are directly proportional to the dimensions of the grey-scale mask shapes 2208 and 2210. Thus, to increase the size of the trim spaces, the grey-scale mask shape is increased.

Returning to FIG. 21, the next step 208 in method 2100 is to deposit the feature material into or through the hybrid resist spaces. For example, where the features being created are metal conductors, an appropriate metal is deposited across the wafer portion 2300. Turning to FIGS. 26 and 27, the cross sections of wafer portion 2300 are illustrated with feature material 2602 deposited across the hybrid resist on wafer portion 2300. The deposition is preferably a conformal deposition that completely fills the feature spaces 2310 and 2312, and fills a portion of the trim spaces 2314 and 2316.

Figure 28:
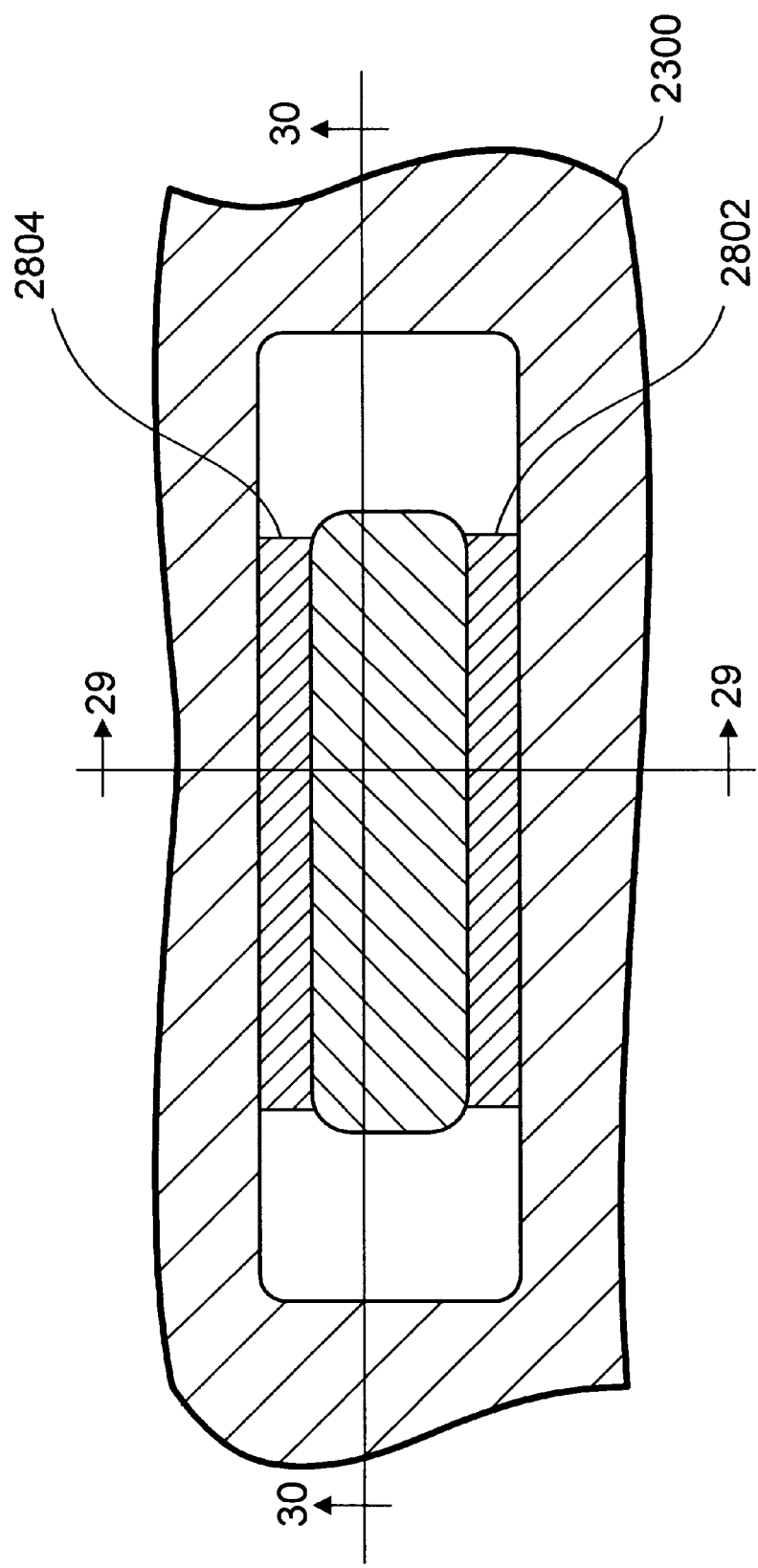
FIG. 28 is a top schematic view of a wafer portion with patterned hybrid resist, deposited feature material that has been isotropically etched in accordance with the first embodiment.

Returning to FIG. 21, the next step 210 in method 2100 is to remove the feature material such as by etching, isotropically etching, or CMP in combination with etching. In the preferred embodiment, the isotropic etch is continued until all feature material is removed, except a portion of the feature material in feature spaces 2310 and 2312, which forms the features themselves Turning to FIG. 28, the wafer portion 2300 with feature material 2602 having been isotropically etched until only the feature material in features spaces 2310 and 2312 remains, forming features 2802 and 2804, is illustrated. The wafer portion 2300 is also illustrated in FIG. 29, a cross sectional view taken along line 29—29 in FIG. 28, and in FIG. 30, a cross sectional view taken along line 30—30 in FIG. 28. The isotropic etch can remove all the feature material in the trim spaces because its "thickness" was limited to the deposition thickness. Conversely, the isotropic etch does not remove all the feature material from the feature spaces because the feature material has a greater thickness there. Because the isotropic etch removed all other feature material, in particular the feature material in the trim spaces, the features 2802 and 2804 are not linked together, and can be used separately.

Figure 31:
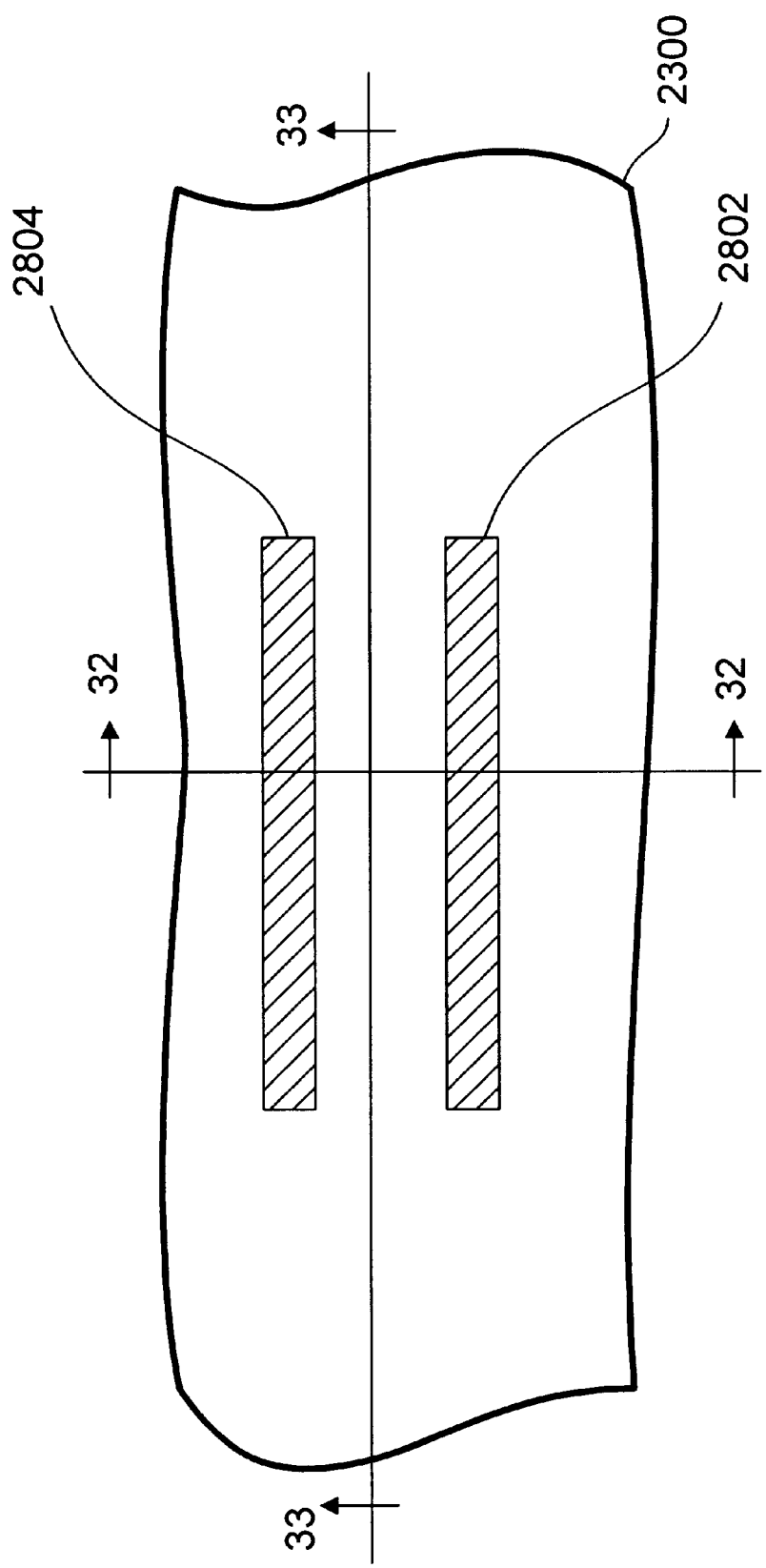
FIG. 31 is a top schematic view of a wafer portion with the hybrid resist stripped leaving feature material in accordance with the first embodiment.

Returning to FIG. 21, the next step 212 in method 2100 is to strip the remaining hybrid resist. This results in the wafer portion 2300 having only features 2802 and 2804 remaining, as illustrated in FIGS. 31, 32 and 33, where FIG. 32 is a cross sectional view taken along line 32—32 in FIG. 31 and FIG. 33 is a cross sectional view taken along line 33—33 in FIG. 31.

Thus, the preferred embodiment allows hybrid resist to create features of sub-critical dimension, using the edge of mask shapes to define the pattern in hybrid resist, without any linking between these features.

Figure 34:
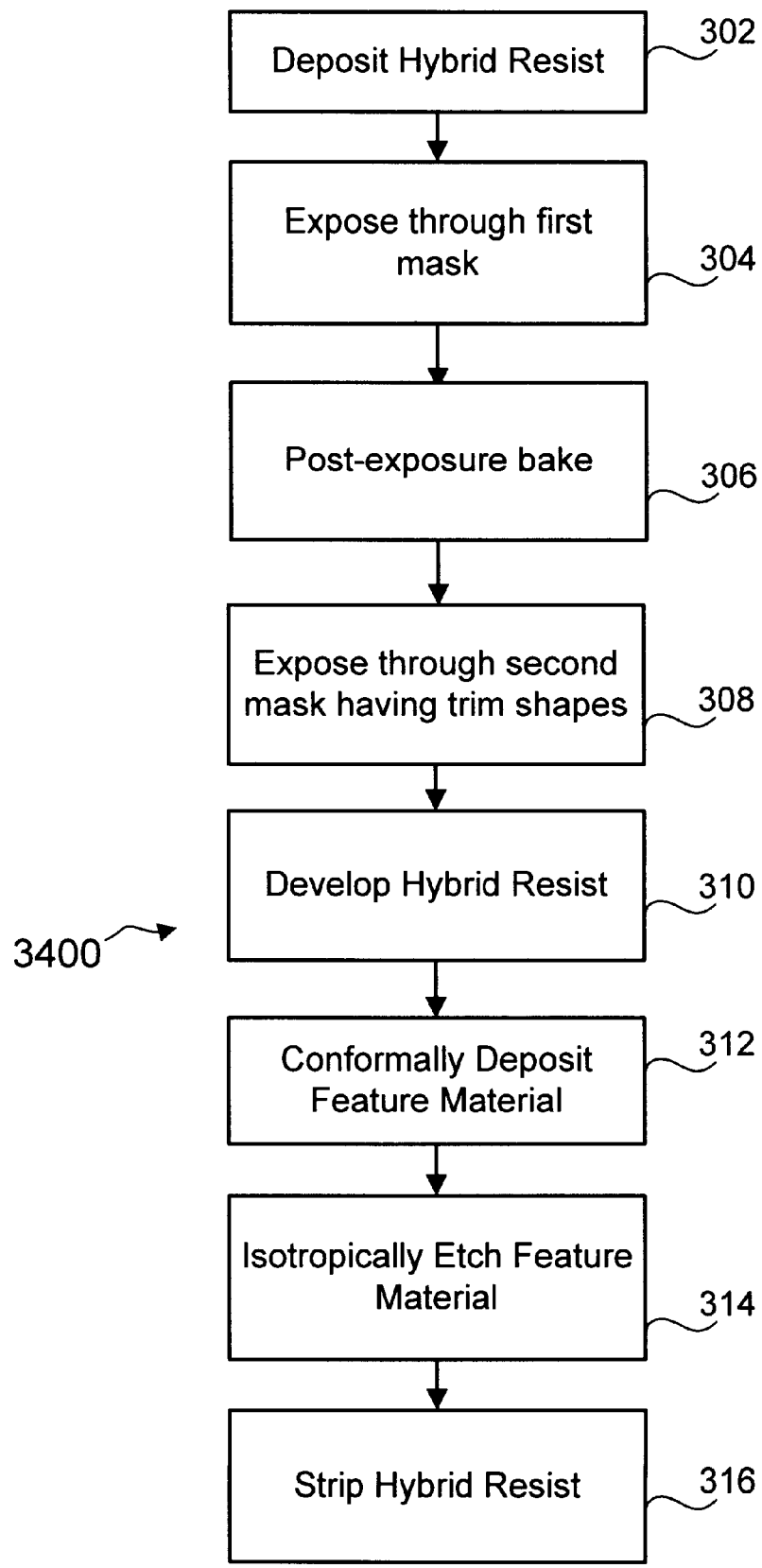
FIG. 34 is a flow diagram illustrating a method in accordance with the second embodiment.

Many other embodiments within the scope of this invention can be used to trim unwanted linking in hybrid resist processes. For example a two-step exposure method 3400 in accordance with a second embodiment is illustrated in FIG. 34. The method 3400 utilizes the unique behavior of some hybrid resist formulations to create self-aligned trim spaces which are adjacent to or overlap the feature spaces. In particular, the method 3400 uses two exposures, with a post-exposure bake following the first exposure but omitted after the second exposure. By omitting the post-exposure bake after the second exposure the previously unexposed portions of hybrid resist behave as normal positive tone resist, while the previously exposed portions are unaffected.

The first step 302 in method 3400 is to deposit the hybrid resist. The next step 304 is perform a first exposure of hybrid resist using a first mask. The next step 306 is to perform a post-exposure bake of the exposed hybrid resist. The post-exposure bake triggers the hybrid response in the hybrid resist, causing the regions of hybrid resist that have been exposed with intermediate amounts of intensity to become soluble to developer. Additionally, the post-exposure bake causes the negative tone areas to become fully cross linked and therefore insoluble to developer. A suitable post exposure bake would be for 60–90 seconds at 90–120 degrees C.

Turning to FIG. 35, a mask portion 3500 suitable for step 304 is illustrated. The mask 3500 has a blocking outside portion 3502 and a non-blocking shape 3504.

Exposing the hybrid resist through mask 3500 and performing a post-exposure bake creates exposure patterns in the hybrid resist. Again, hybrid resist portions which are exposed with high intensity radiation (i.e., the areas under non-blocking shape 3504) form a negative tone line pattern, with resist that has been substantially cross-linked to form the polymer which reduces solubility in the usual negative tone manner. Hybrid resist portions which are unexposed (i.e., the areas blocked by blocking region 3502) form positive tone line patterns. Hybrid resist portions which are exposed with intermediate amounts of intensity (i.e., the areas around the edges of blocking mask shape 3504) are soluble to the developer.

The next step 308 is to expose the hybrid resist through a second mask having trim shapes. Turning to FIG. 36. a suitable mask portion 3600 for step 306 is illustrated. The mask portion 3600 contains a blocking outside region and non-blocking trim shapes 3604 and 3606. The non-blocking trim shapes 3604 and 3606 are preferably placed to expose regions adjacent those exposed through non-blocking mask shape 3504, with a small amount of overlap.

During step 308, the resist areas under the non-blocking trim shapes are exposed to actinic radiation. Where this exposure overlaps with positive tone patterns (i.e., the previously unexposed areas of resist), the exposure causes the positive tone components of the hybrid resist to become soluble to developer. In particular, because no post-exposure bake follows this second exposure, all areas of positive tone resist that are exposed to radiation remain soluble instead of only the intermediate exposure areas being soluble. Furthermore, because there is no post-exposure bake, negative tone patterns are not formed in regions where the second exposure overlaps with the previous intermediate exposure areas. Where this exposure overlaps with the previously formed negative tone patterns, no change occurs in the negative tone hybrid resist chemistry and the negative tone pattern remains insoluble in developer.

In this embodiment it is preferred to use a hybrid resist formation that behaves as a positive tone resist if processed without a post-exposure bake. Thus, by exposing and baking a hybrid resist, then exposing the hybrid resist a second time with a different reticle and then developing the hybrid resist, a relatively larger trim space can be formed in addition to the feature spaces. The first exposure and baking creates the feature spaces at the edges of the reticle (where the hybrid resist is exposed to an intermediate amount of exposure). The second exposure, through a different reticle, and without a second post-exposure bake creates a trim space by using remaining positive tone patterns of hybrid resist. The trim spaces are partially self-aligned with the feature spaces because they form only in the initially un-exposed portions of the hybrid resist. In particular, because the areas of resist that were fully exposed during the first exposure become cross-linked and insensitive to further irradiation (e.g., they form a negative tone pattern) those portions are unchanged by the second exposure. Furthermore, the areas of hybrid resist that were exposed to intermediate amounts of exposure and made soluble by the post-exposure bake are unaffected by the second exposure because without a second post-exposure bake the negative tone image chemistry does not occur.

Thus, the trim space reticles can be allowed to overlap the negative tone patterns and original feature space regions in the hybrid resist without affecting the formed pattern in those areas.

The next step 310 is to develop the hybrid resist. Portions of hybrid resist that were exposed with high intensity radiation followed by a post-exposure bake and formed a negative tone line pattern (i.e., the areas under non blocking mask shape 3504 during step 304) are insoluble in developer and are not washed away. Hybrid resist portions which were unexposed (i.e., the areas blocked by blocking region 3502 during step 304 and blocking region 3602 during step 308) are insoluble and remain photoactive, thus forming positive tone line patterns. Hybrid resist portions which were exposed with intermediate amounts of intensity followed by a post-exposure bake (i.e., the areas around the edges of blocking non blocking mask shape 3504 exposed to intermediate amounts during step 304) are soluble and wash away during development. Hybrid resist portions which were exposed and in which no post-exposure bake followed (i.e., the areas under the trim shapes 3604 and 3606 in step 310) are soluble and wash away during development.

Figure 37:
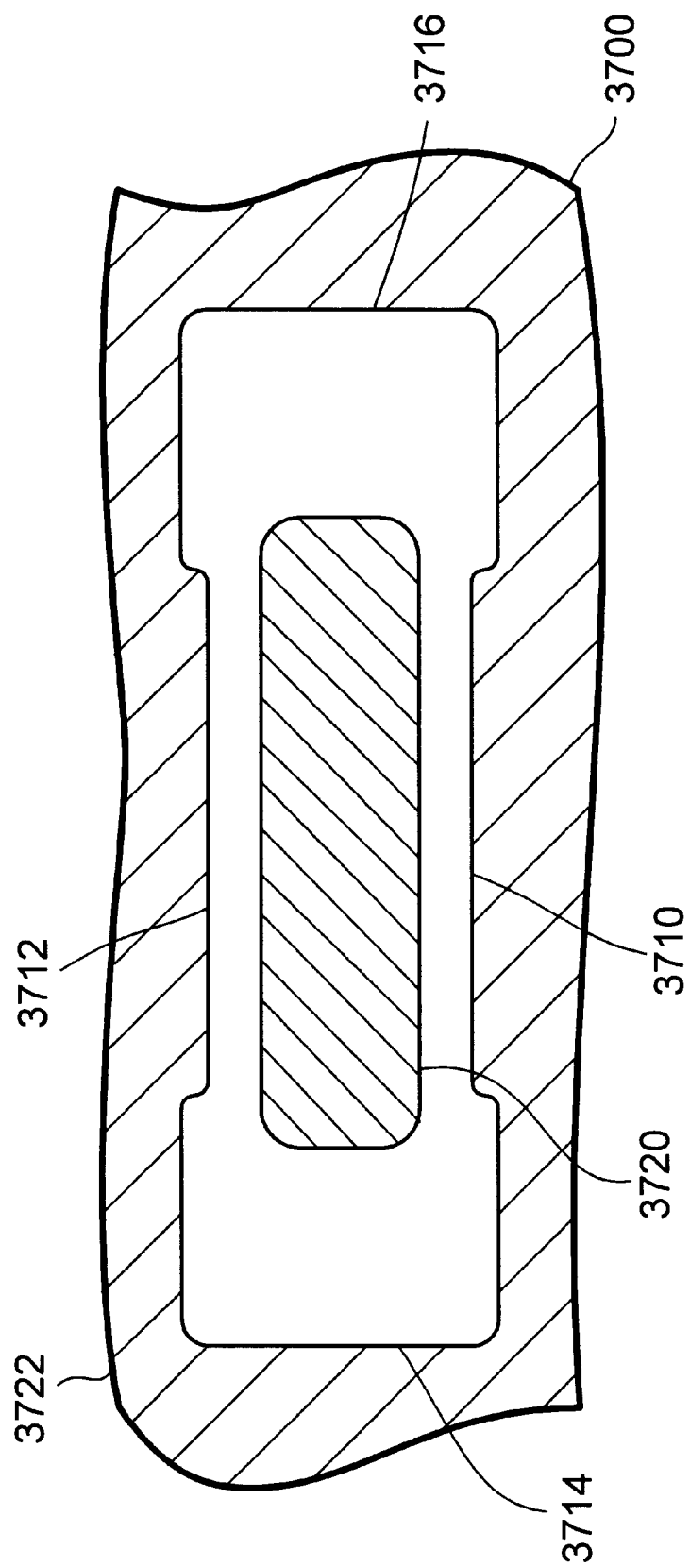
FIG. 37 is a top view of a wafer portion with patterned hybrid resist in accordance with the second embodiment.

Turning to FIG. 37, a wafer portion 3700 having hybrid resist deposited, and patterned according to method 3400, using mask portions 3500 and 3600 in steps 304 and 308 respectively, is illustrated.

The patterned hybrid resist on wafer portion 3700 a negative tone pattern 3722, a positive tone pattern 3720, feature spaces 3710 and 3712 and trim spaces 3714 and 3716. Again, the trim spaces, when filled with feature material and isotropically etched, will allow the links between features to be removed. In particular, the next steps in method 3400 are the same as those in method 2100. In particular during step 312 feature material conformally deposit across the wafer, isotropically etched in step 314, and the remaining hybrid resist stripped in step 316. This creates non-linked features similar to those created by method 2100.

In a variation on this embodiment, a second post-exposure bake is carried out after the second exposure step. In this embodiment the second exposure preferably comprises an exposure at a lower intensity, such that areas of resist under the non blocking trim shapes are exposed to intermediate amounts and are soluble to the developer. When the second exposure is at intermediate levels of intensity and a second post-exposure bake follows, the hybrid resist areas under the non-blocking trim shapes which exposed to intermediate amounts of radiation become soluble according to the usual hybrid resist response. It should be noted that these portions of hybrid resist were unexposed during step 304 and thus remained photoactive for use in step 308.

During development, the areas of hybrid resist that were exposed to intermediate amounts may or may not be developed away, depending on process conditions. This includes the areas of hybrid resist which were exposed with intermediate amounts of intensity during the first exposure (i.e., the areas around the edges of blocking non blocking mask shape 3504) and those exposed to intermediate amounts of intensity during the second exposure (i.e., the areas under non-blocking shapes 3604 and 3606 during the second exposure).

A third embodiment in accordance with the present invention relies on diffraction effects to form the relatively wide trim spaces in the hybrid resist. This embodiment is particularly applicable to x-ray lithography, although it is applicable to conventional lithography as well.

In particular, in experiments using hybrid resist in x-ray lithography diffraction effects have been commonly observed at the edges of reticle patterns. These diffraction effects cause variations in the exposure intensity received by the hybrid resist. These diffraction effects are most pronounced at the end-edges of elongated shapes. This is because there are three shape edges contributing to the diffraction effect near the end-edges. In contrast, in the middle regions of the elongated shape only two edges contribute to the diffraction effect.

The more pronounced diffraction effects at the end-edges of elongated shapes cause a relatively wider area of hybrid resist to be exposed to intermediate amounts of radiation compared to the middle-edges of the elongated shape. Following a post-exposure bake and development, this causes relatively wide spaces at the end-edges of the elongated shapes.

Thus, by choosing elongated reticle shapes and appropriate exposure gap settings in an x-ray exposure tool, relatively wide trim spaces can be formed in the hybrid resist due without the use of added process steps. For example, it was determined that a 0.3–0.4 $\mu$m wide reticle shape with x-ray lithography at a 40 $\mu$m gap setting to print hybrid patterns where the width of the intermediate exposure space at the end-edge of the shape is approximately twice as large as the width of the hybrid image at the mid-section edges of the shapes.

These relatively wide spaces can be used as trim spaces in accordance with the present invention. In particular, these relatively wide trim spaces can be filled along with the relatively narrow feature spaces with featured material, and isotropically etched to create unlinked features.

Figure 38:
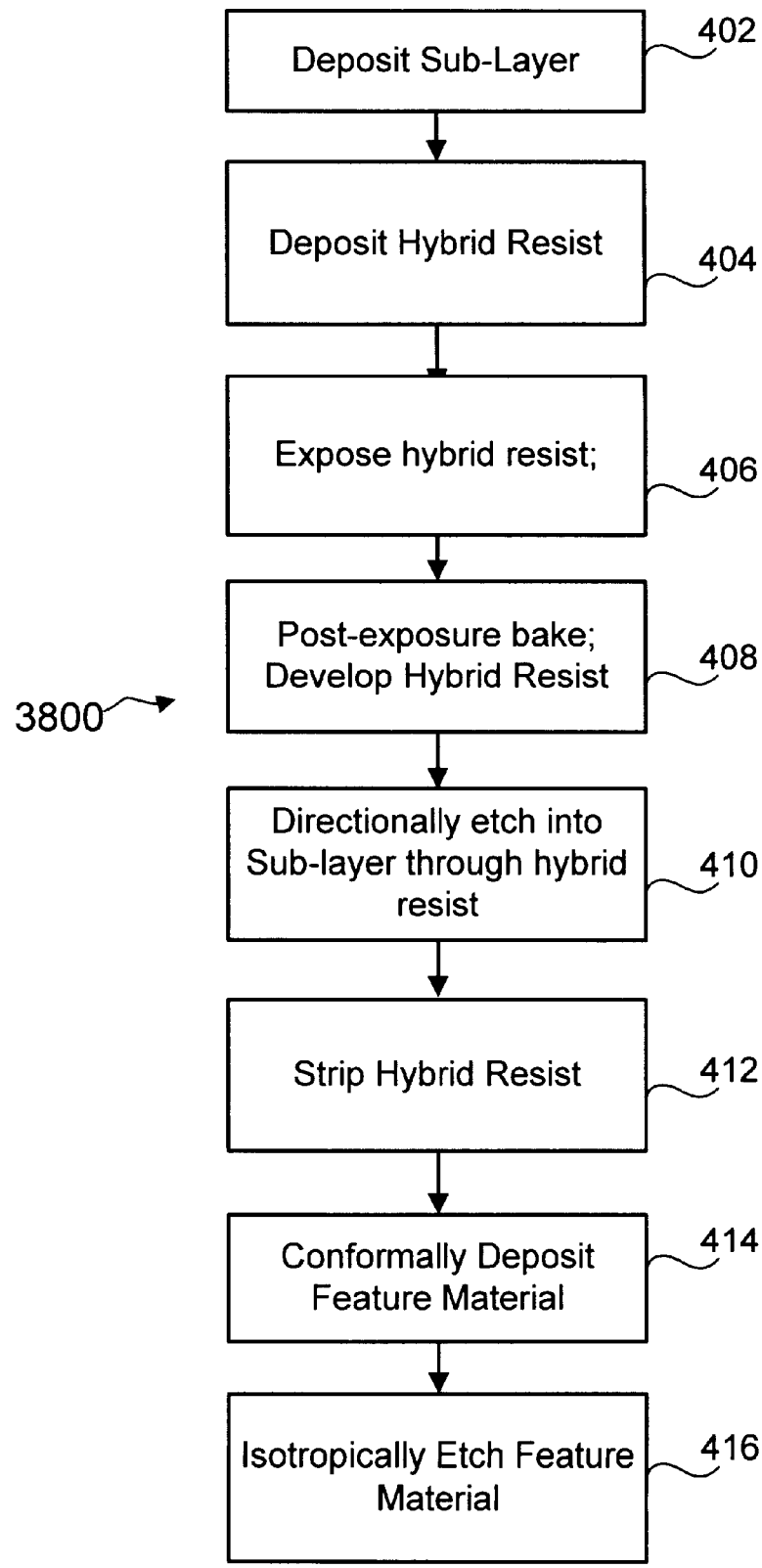
FIG. 38 is flow diagram illustrating a third method in accordance with a third embodiment.

Turning to FIG. 38, a method 3800 in accordance with a fourth embodiment of the present invention is illustrated. In this embodiment, a sacrificial sub-layer is used to define the formed features. The first step 402 is to deposit the sub-layer material on the wafer. The sub-layer material can comprise any suitable sacrificial sub-layer material, such as silicon dioxide or another dielectric, or suitable polymers. Hybrid resist is then deposited, exposed, baked and developed in steps 404–408. The exposure process can be either the single step illustrated in method 2100, or the two step exposure process illustrated in method 3400. In either way, the hybrid resist is patterned with feature spaces and trim spaces as in the other embodiment.

The next step 410 is to directionally etch into the sub-layer. This patterns the feature spaces and trim spaces into the sub-layer. The hybrid resist is then stripped in step 412.

In step 414, the feature material is conformally deposited across the patterned sub-layer. Again, the sub-layer feature spaces are narrow enough to be completely filled with feature material, while the sub-layer trim spaces are wide enough such that a gap exists in the feature material. In step 416, an isotropic etch of the feature material results in the feature material being removed from the sub-layer trim spaces while remaining in the sub-layer feature spaces. The sub-layer can then be removed, with the non-linked features remaining.

It should also be noted that the preferred trim methods do not require that the features be trimmed only at their edges. For example, grey scale portions can be placed in the middle of blocking shapes to cause the features to be trimmed at that location. Additionally, a single "loop" could be broken into many different features by using many grey scale portions.

Thus, the preferred embodiments provide a method for trimming linked features created by the hybrid resist process. This allows hybrid resist, with its associated ability to create features with sub-critical dimensions using current lithographic equipment, to be used in a greater variety of applications.

The preferred trimming methods can be applied to facilitate the use of hybrid resist in a wide variety of applications. One of these application is the fabrication of dynamic random access memory chips or DRAM chips. DRAM chips are used extensively in computer applications where large amounts of inexpensive yet relatively high performance memory is needed. As more advanced applications are developed, an increasing large amount of DRAM is needed. This has driven an ever increasing need for greater device densities and economical ways of producing these devices.

A typical DRAM chip is made of millions of individual DRAM "cells." Each cell contains a capacitor used to the memory charge, a switch used to access the capacitor, and some isolation regions around these devices. The individual cells are accessed using a large number of bit lines and word lines. By selecting an appropriate bit line and word line, a memory controller can access information contained in the desired DRAM cells.

The density of a DRAM chip is determined in a large part by the area needed for each DRAM cell. This area is often measured in terms of "squares," where a square comprises a 1F×1F square region where "F" is the minimum feature dimension that can be created using an aerial image in a given lithography system. Thus, an 8 SQ DRAM cell created by a 0.35 μm lithography system comprises an area of eight 0.35 μm by 0.35 μm squares on the chip.

Hybrid resist can be used to create DRAM cells with features that have sub-critical dimensions using standard photolithography. This facilitates the creation of DRAM cells that have smaller cell size. For example, as discussed above, hybrid resist allows features to be created with 0.2 μm or less dimensions using standard 0.35 μm fabrication equipment. By using this ability a DRAM cell can be created having a 6 SQ (or less) size. Of course, those skilled in the art will recognize that this is taking a small liberty with terms, as the "SQ" is traditionally defined as the minimum feature size, which in reality has been decreased through the use of hybrid resist. Thus, while the exemplary DRAM cell may in fact be a 6 SQ (or less) cell when measured by the minimum feature dimension of the fabrication system using normal resist, it could be considered an 8 SQ design if the hybrid resist minimum feature size is considered.

Figure 39:
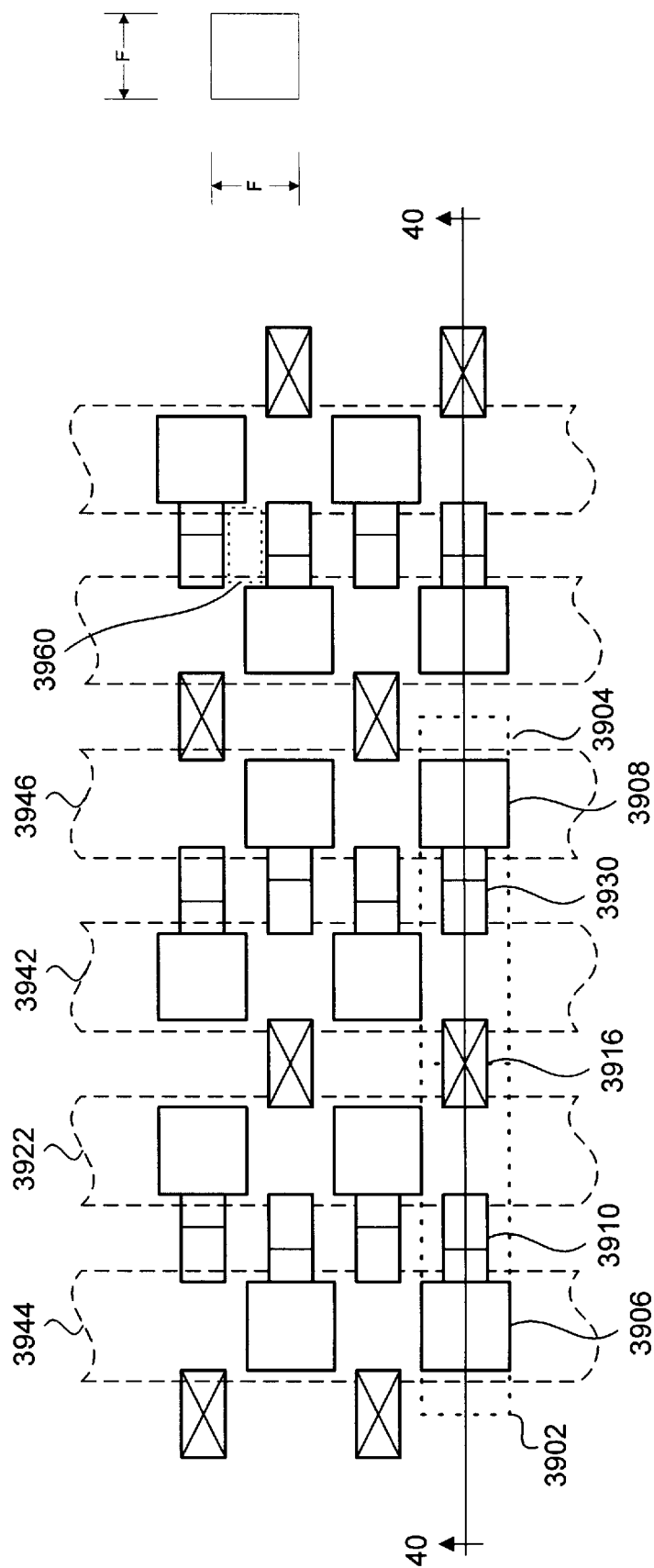
FIG. 39 is a top schematic view of a DRAM device portion.
Figure 40:
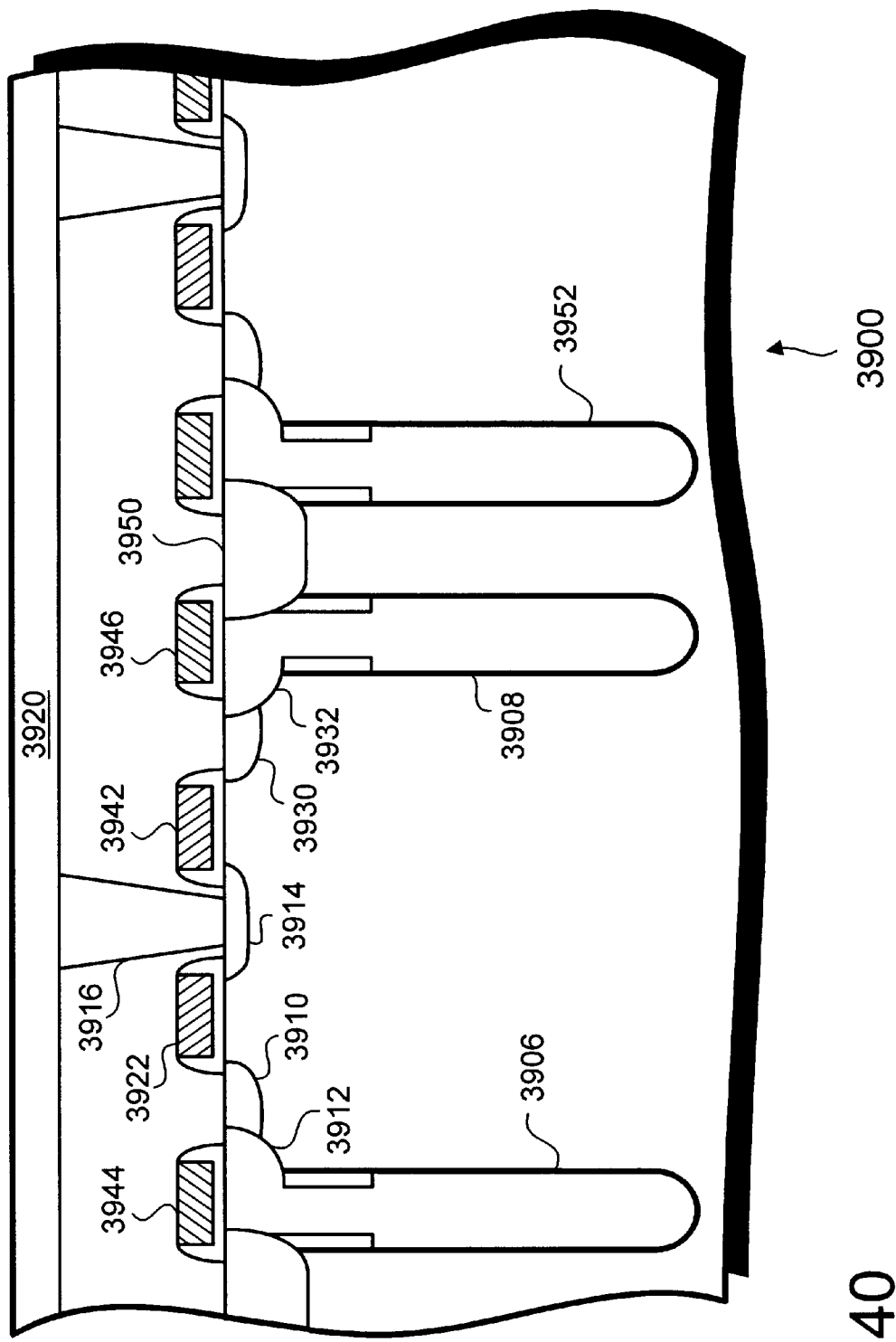
FIG. 40 is a cross sectional side view of the DRAM portion of FIG. 39 taken along line 40—40.

Turning to FIGS. 39 and 40, an exemplary 6 SQ (or less) merged isolation and node trench (MINT) DRAM portion 3900 is illustrated. FIG. 39 is a schematic top view of the DRAM cells, with some portions of the cells not being illustrated. FIG. 40 is a cross sectional side view of the DRAM portion 3900 taken along line 40—40 in FIG. 39. While a MINT DRAM portion is used to illustrate the preferred embodiments, those skilled in the art will recognize that the invention can be applied to other kinds of DRAM cells where appropriate. The DRAM portion 3900 includes sixteen 6 SQ (or less) DRAM cells, of which two, DRAM cell 3902 and 3904 are distinguished using dotted lines around the perimeter of the cell. Each DRAM cell includes a trench capacitor, such as trench capacitor 3906 and 3908 in DRAM cell 3902 and 3904 respectively.

Each DRAM cell also includes a switch, a specialized transistor used to access the capacitor. The switch transistor includes a drain region connected to the capacitor through a buried strap, a source region connected to the bit line, and a gate which comprises a portion of the word line. For example, in DRAM cell 3902 capacitor 3906 is connected to drain region 3910 through buried strap 3912. Additionally, source region 3914 is connected to the bit line 3920 through bit line interconnect 3916. The word line 3922 serves as a gate of the switching transistor.

Likewise, in DRAM cell 3904 capacitor 3908 is connected to drain region 3930 through buried strap 3932. The word line 3942 serves as a gate of the switching transistor. The DRAM cell 3904 shares the bit line interconnect 3916 and source region 3914 with the neighboring DRAM cell 3902.

The two word lines 3922 and 3942 that connect to the DRAM cells are called the "active" word lines DRAM cells 3902 and 3904 respectively. The DRAM cells 3902 and 3904 also contain "passing" word lines 3944 and 3946 respectively, which connect to adjacent DRAM cells (for which they would be active word lines) but pass over these particular DRAM cells.

In the preferred embodiment, shallow trench isolation, commonly referred to as STI, is used to isolate various DRAM cell components from those on other DRAM cells. For example, a STI region 3950 isolates the capacitor 3908 from the capacitor 3952 in the adjacent DRAM cells. For purposes of defining the cell boundaries, half of the STI region 3950 is considered to be in DRAM cell 3904 while the other half is in the adjacent cells. Similar STI regions isolate the active areas of the DRAM cells from those of adjacent DRAM cells in the vertical direction (i.e., along the wordline). For example, region 3960 in FIG. 39 shows where an STI region would isolate the drain region of a cell from the drain region of the cell above it.

The size of the STI regions is a great portion of the size of the DRAM cell. In the prior art, the minimum size of the STI region was determined by the resolution of the lithography system. In the preferred embodiment, hybrid resist is used to form STI regions with sub-critical dimensions and will thus allow the DRAM cell to be formed in a 6 SQ (or less) area.

Figure 41:
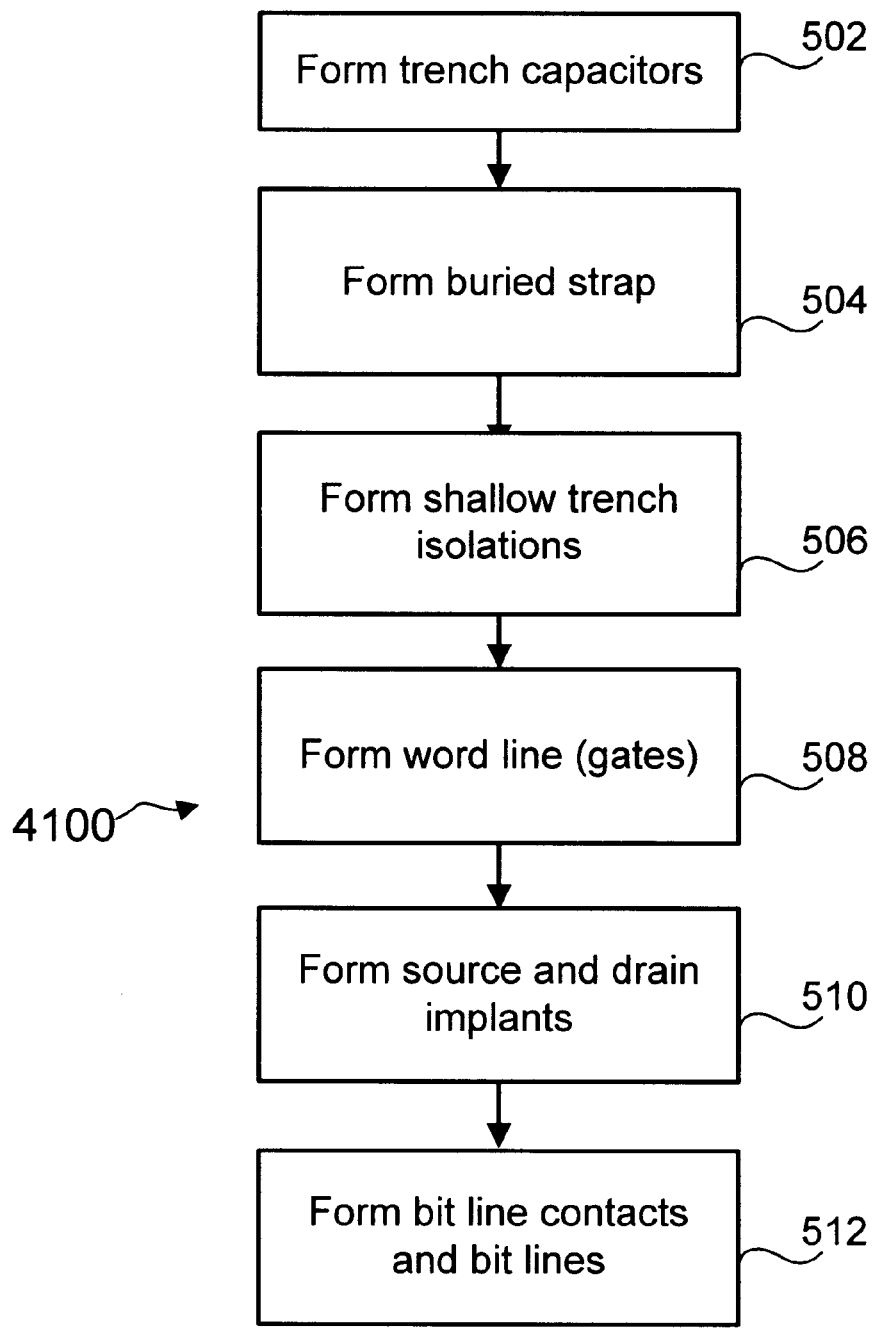
FIG. 41 is a flow diagram illustrating a method for forming a DRAM device using hybrid resist.

Turning to FIG. 41 a DRAM cell fabrication method 4100 that utilizes hybrid resist and the preferred embodiment trim process is illustrated. The method 4100 begins with a semiconductor wafer that has been appropriately cleaned and prepared The first step 502 is to form the trench capacitors. In the preferred embodiment, these trench capacitors include silicon oxide ($SiO_2$) collars around the top edges of the capacitor, as is known in the art to reduce parasitic transistor action with adjacent elements. One suitable method for forming the trench capacitors is use a pad structure as the hard mask to etch the trenches. The pad structure could typically comprises 100–150 Å of isolation oxide, the ~2200 Å of silicon nitride ($Si_3N_4$) and 7000 Å of oxide) The mask is patterned, and used to etch the trenches in which the capacitors are formed.

In the preferred embodiment, the trench capacitors are formed at the minimum feature size for the lithography.

Figure 42:
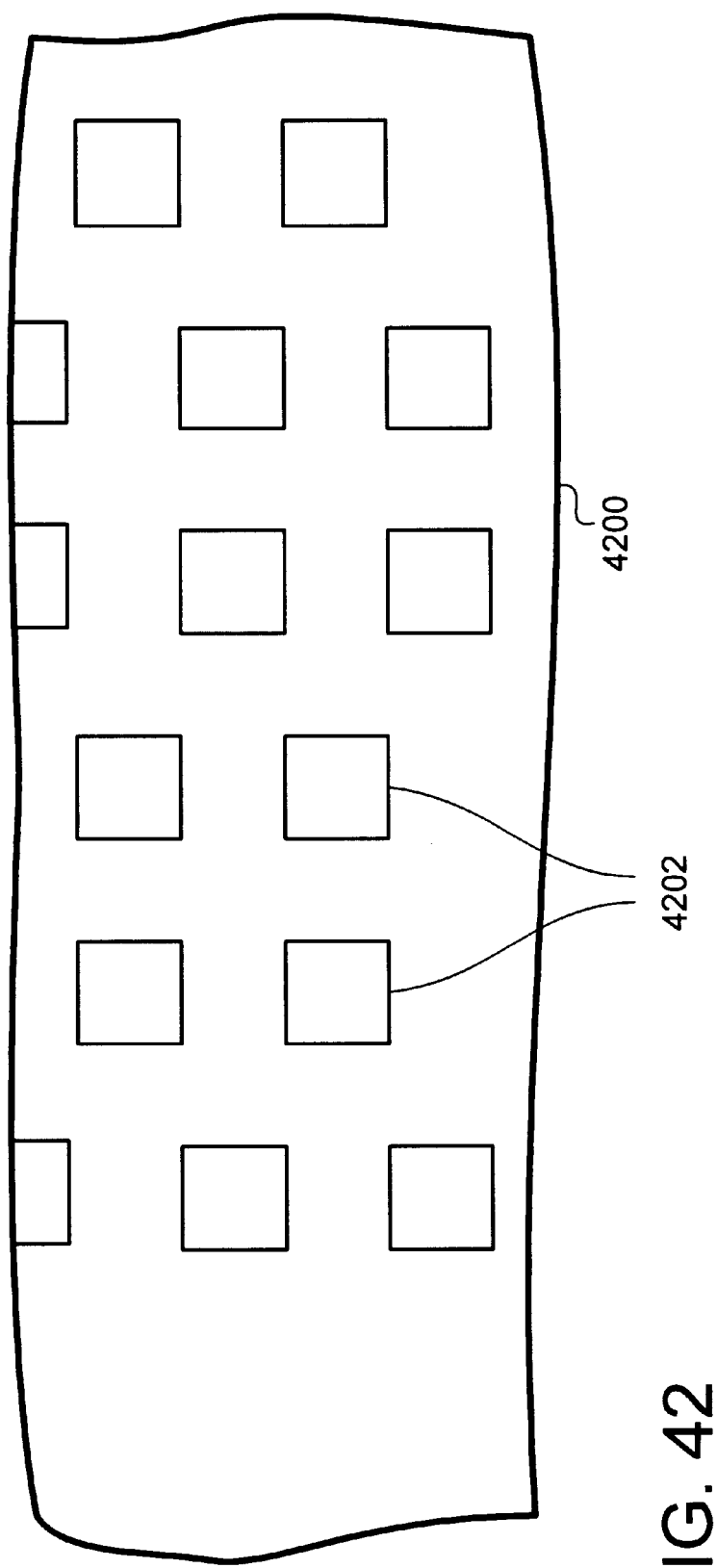
FIGS. 42, 43, 45, 46, 48–50, 52–55 illustrate a DRAM portion in various stages of fabrication.

Turning to FIG. 42, a semiconductor portion 4200 is illustrated. The semiconductor portion 4200 includes an array of trench capacitors 4202. In the preferred embodiment, these trench capacitors include oxide collars and are formed at minimum feature size.

The next step 504 in method 4100 is to form the buried straps. Buried straps are used in the preferred embodiment to connect the trench capacitors to the switches in the DRAM cells. Buried straps are typically formed using outdiffusion. In particular, the portion of the oxide collar in the trench capacitor where the buried strap is to be formed is removed. Polysilicon is then blanket deposited in the place of the removed oxide collar. The trench capacitor is then shorted to the wafer single crystal silicon, causing the dopant to outdiffuse from inside the trench capacitor and into the buried strap region.

Figure 43:
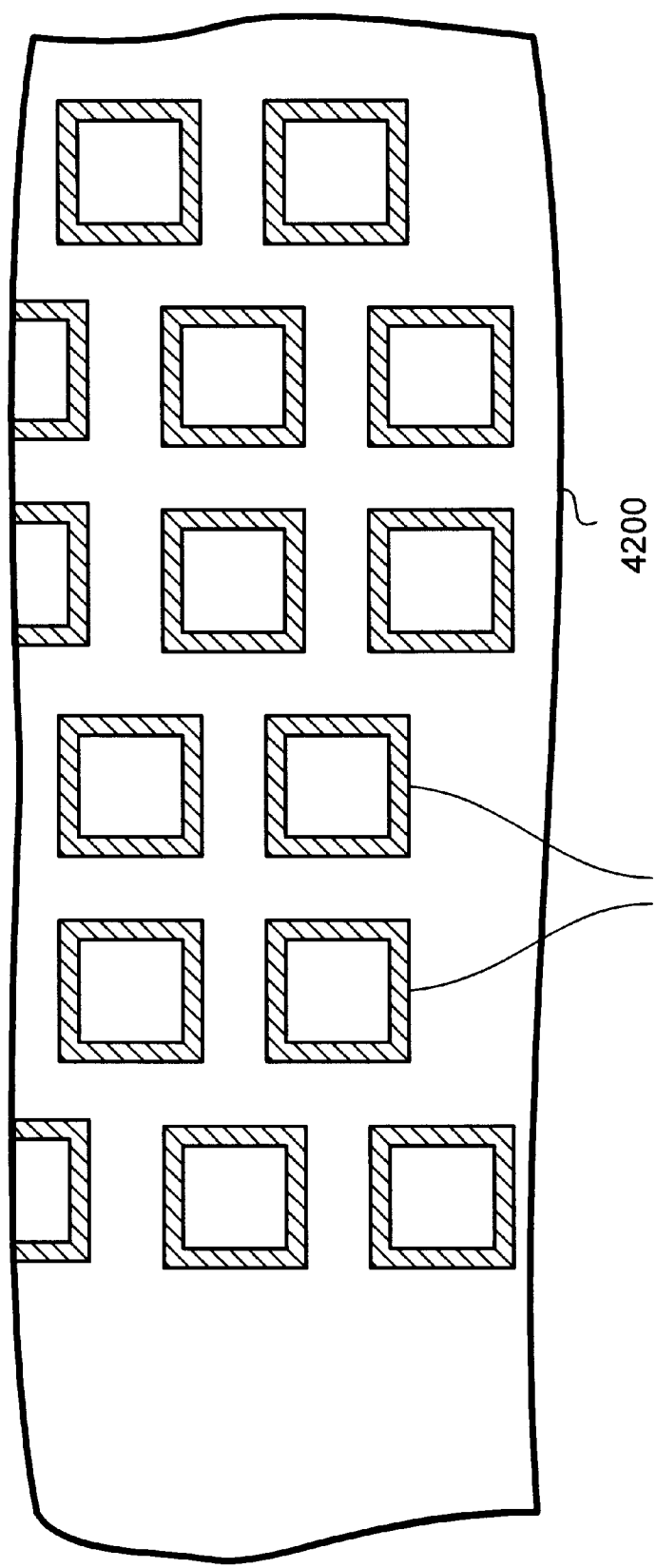

Of course, a buried strap is just one type of connection structure between the trench capacitor and switch that can be used, and this is just one method for forming the buried strap. Turning to FIG. 43, the wafer portion 4200 is illustrated with buried straps 4802 formed adjacent the trench capacitors. A cross section of buried straps can be seen in FIG. 39

The next step 506 is to form shallow trench isolation (STI) regions to isolate elements of the DRAM cells from on another. In accordance with the preferred embodiment, portions of the STI regions are formed using hybrid resist, thus allowing them to formed with sub-critical dimensions. In particular, the STI portions formed between adjacent DRAM cells are formed at subcritical dimensions using hybrid resist, while STI regions between trench capacitors are formed using normal lithography and at normal dimensions.

To form the STI regions using hybrid resist, the hybrid resist is deposited and exposed through a mask, causing areas that exposed to intermediate amounts of radiation to become soluble and wash away during development. The STI trenches can then be etched through the openings in the hybrid resist.

There are two methods that can be used to form the STI regions in the preferred DRAM design. The first uses two masks with two exposures and developments to form the STI regions. The second uses a single mask with the grey scale regions that form the STI regions.

Figure 44:
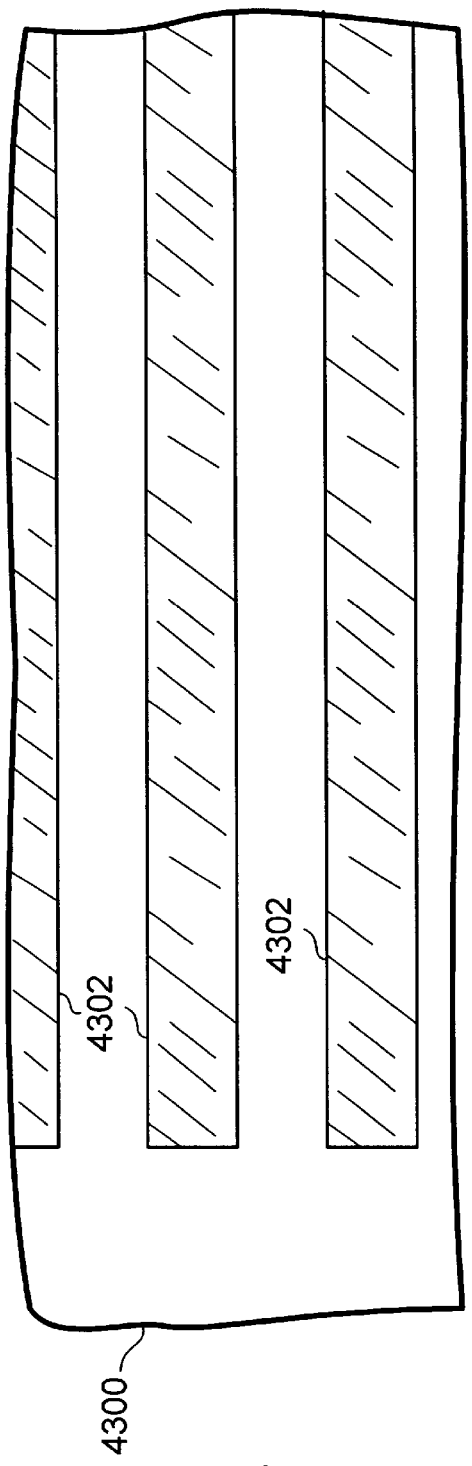
FIGS. 44, 47, 51 illustrate mask portions used to fabricate the DRAM portions.
Figure 45:
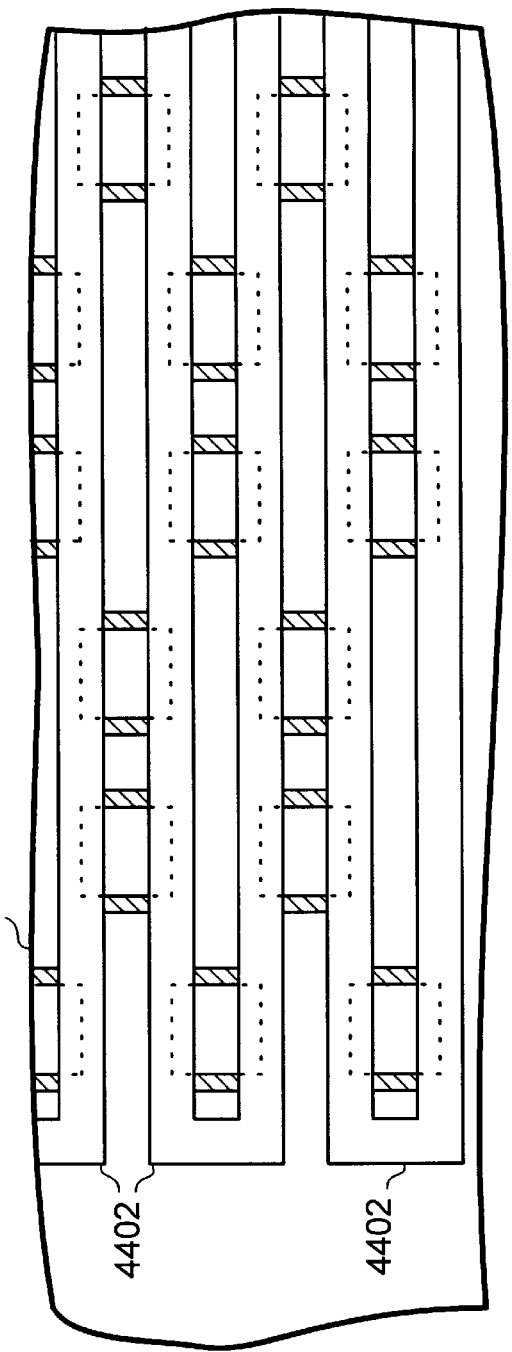

Turning to FIG. 44, a suitable mask portion 4300 for use in the method is illustrated. The mask portion 4300 includes a plurality of mask shapes 4302. When hybrid resist is deposited on the wafer portion 4200, exposed through mask portion 4300 and developed, a pattern in the resist is formed. In particular, openings in the resist are formed at the edges of the mask shapes 4302. Because of the unique properties of hybrid resist, these openings can have a sub-critical width. Trenches are then formed in the wafer portion 4200 by etching through the openings. The hybrid resist is then stripped, the trenches filled (suitably with a nitride liner and an oxide core), and wafer polished and planerized. This forms STI regions 4402 between adjacent DRAM cells in the as illustrated in FIG. 45. The formation of the STI removes the buried strap where the STI region and the buried strap overlap.

Figure 46:
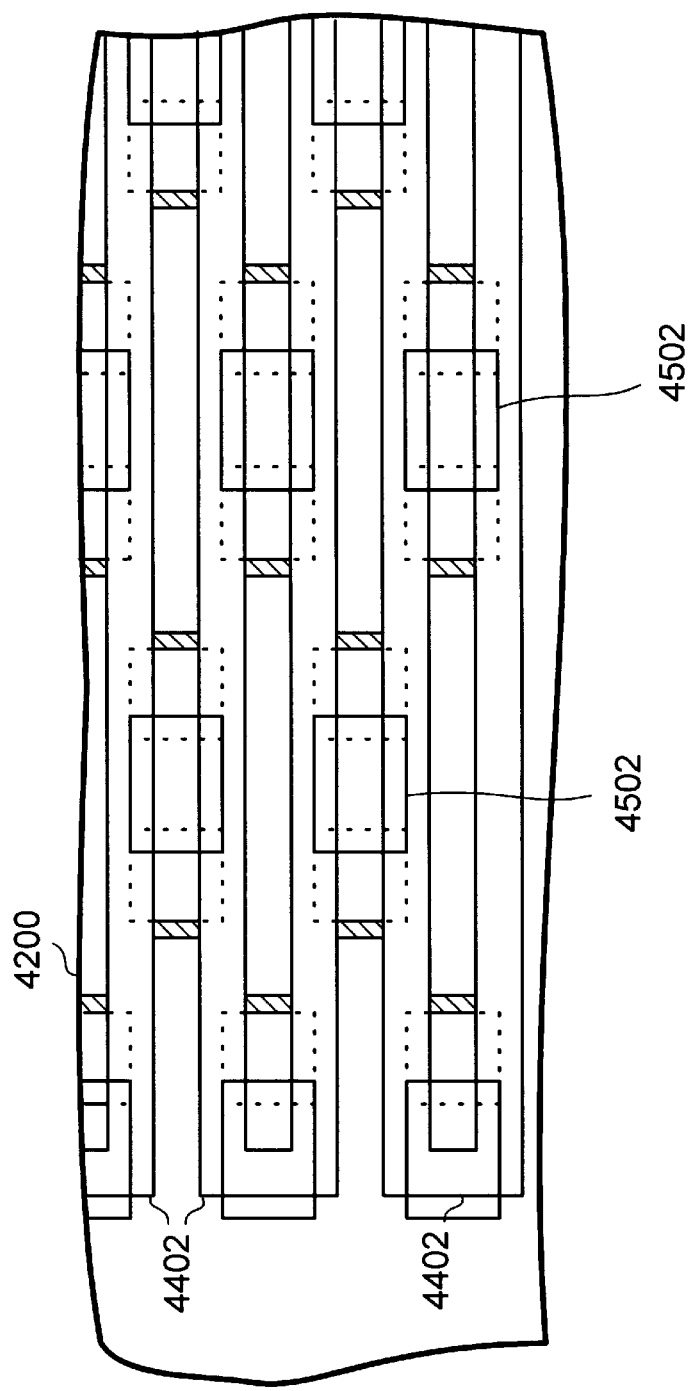

Next STI portions are formed between adjacent trench capacitors. This can be done using normal photoresist and normal lithography techniques (i.e., patterning resist, etching and filling). Turning to FIG. 46, the wafer portion 4200 is illustrated with STI regions 4502. Again, the formation of the STI removes the buried strap where they overlap.

Alternatively, instead of etching and filling the STI regions 4402 and then etching and filling the STI regions 4502, the trenches for STI regions 4402 can be formed using hybrid resist, the resist stripped, and new resist deposited and patterned, the trenches for STI regions 4502 etched, the resist striped, and the trenches for 4402 and 4052 filled and planerized together. This method uses less processing steps, but results in STI trenches that are twice as deep where the two STI regions overlap.

Figure 47:
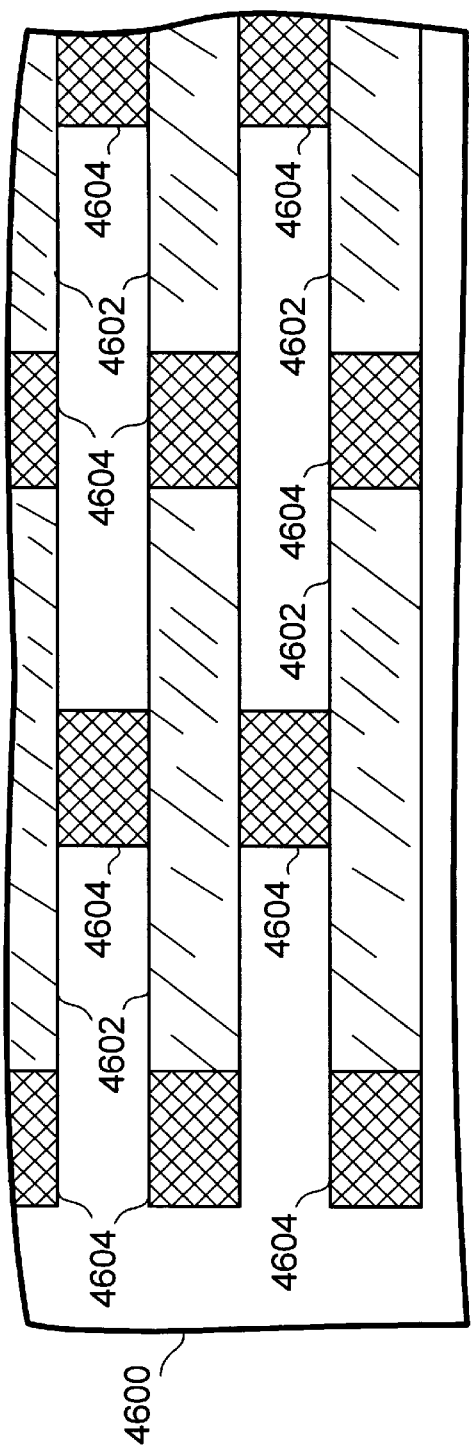

The second method for forming the STI regions uses a single mask with grey scale portions that define the STI regions between adjacent trench capacitors. This method has the advantage of requiring fewer process steps and also reduces the possibility of mask overlay errors. Turning to FIG. 47, a mask portion 4600 is illustrated for forming the STI regions. The mask portion 4600 includes a plurality of blocking mask shapes 4602 which are used to form the STI regions between adjacent cells in the vertical direction and a plurality of grey scale shapes 4604 used to form the STI regions between adjacent trench capacitors.

Figure 48:
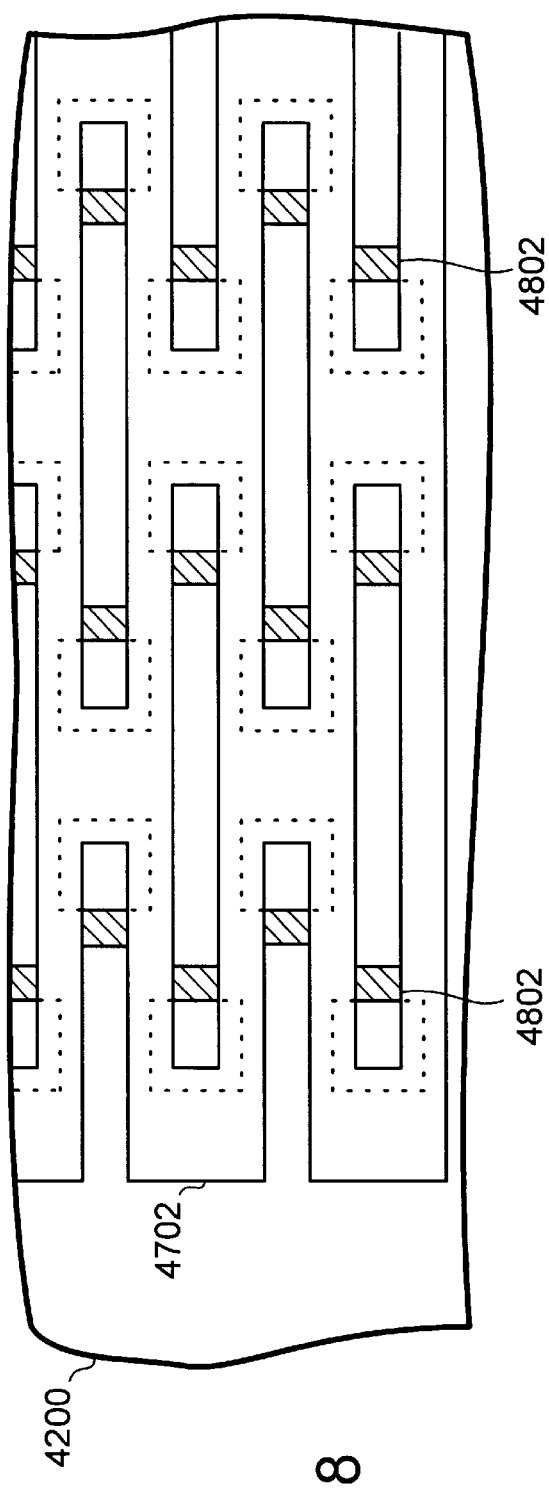

When hybrid resist is deposited on the wafer portion 4200, exposed through mask portion 4600 and developed, a pattern in the resist is formed. In particular, openings in the resist are formed at the edges of the blocking mask shapes 4602 and under the grey scale shapes 4604. Because of the unique properties of hybrid resist, the openings under the edges of the blocking mask shapes 4602 can have a sub-critical width. Trenches are then formed in the wafer portion 4200 by etching through the openings. The hybrid resist is then stripped, the trenches filled (suitably with a nitride liner and an oxide core), and wafer polished and planerized. This forms STI regions 4702 between adjacent DRAM cells and between adjacent trench capacitors as illustrated in FIG. 48.

Again, this method removes the buried strap 4802 where it overlaps with the STI regions 4702.

It should be noted that in the preferred embodiment, the STI regions overlap the top portions of the trench capacitors, but are much shallower than trench capacitors. For example, a typical preferred STI region has a depth of 2500–3000 Å while a preferred trench capacitor has a depth of between 7 and 9 $\mu$m. It should also be noted that the hybrid resist procedure for forming STI regions does result in linked STI regions, but that linking is not usually an issue for STI regions and thus the preferred embodiment does not generally require that the linking portions be trimmed during fabrication. If it was desirable to trim the linking portions, any of the method described above could be used.

The next step 508 is to form the word lines. The wordlines serve as connections to the DRAM cells and serve as the gate for the DRAM cell switch. The wordlines are preferably formed by growing gate oxide, depositing the conductor material, patterning and etching the conductor material and gate oxide. In the preferred embodiment, with the DRAM comprising a folded bitline architecture, an active word line and a passive word line pass over each DRAM cell, with the active word line connected to that cell and the passive bit line connected to an adjacent cell.

Figure 49:
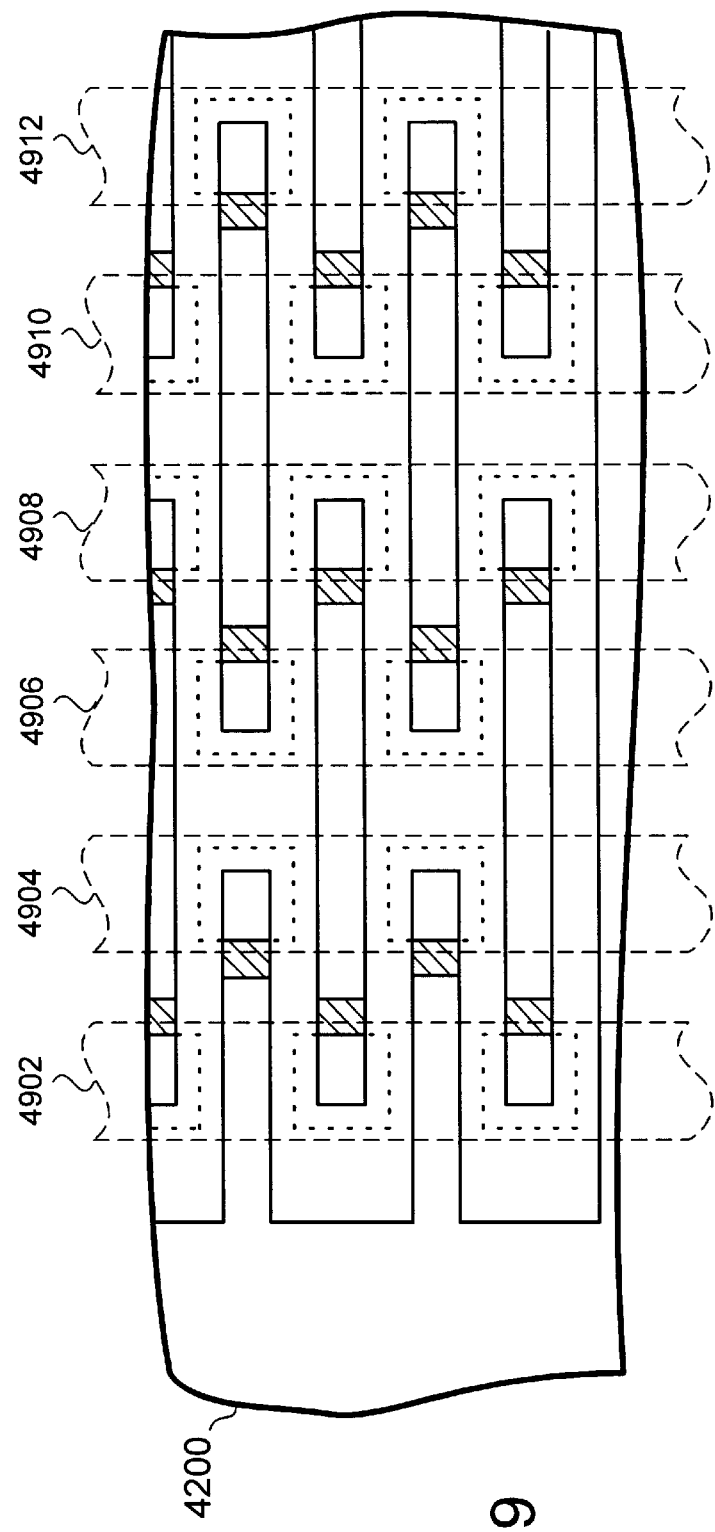

Turning to FIG. 49, the wafer portion 4200 is illustrated with word lines 4902, 4904, 4906, 4908, 4910 and 4912 formed above the other DRAM elements.

The next step 510 is to form the source and drain implants for the DRAM cell switches. These implants are formed by blanket implanting in the wafer portion. The wordlines and STI regions define the borders the source and drain regions.

Figure 50:
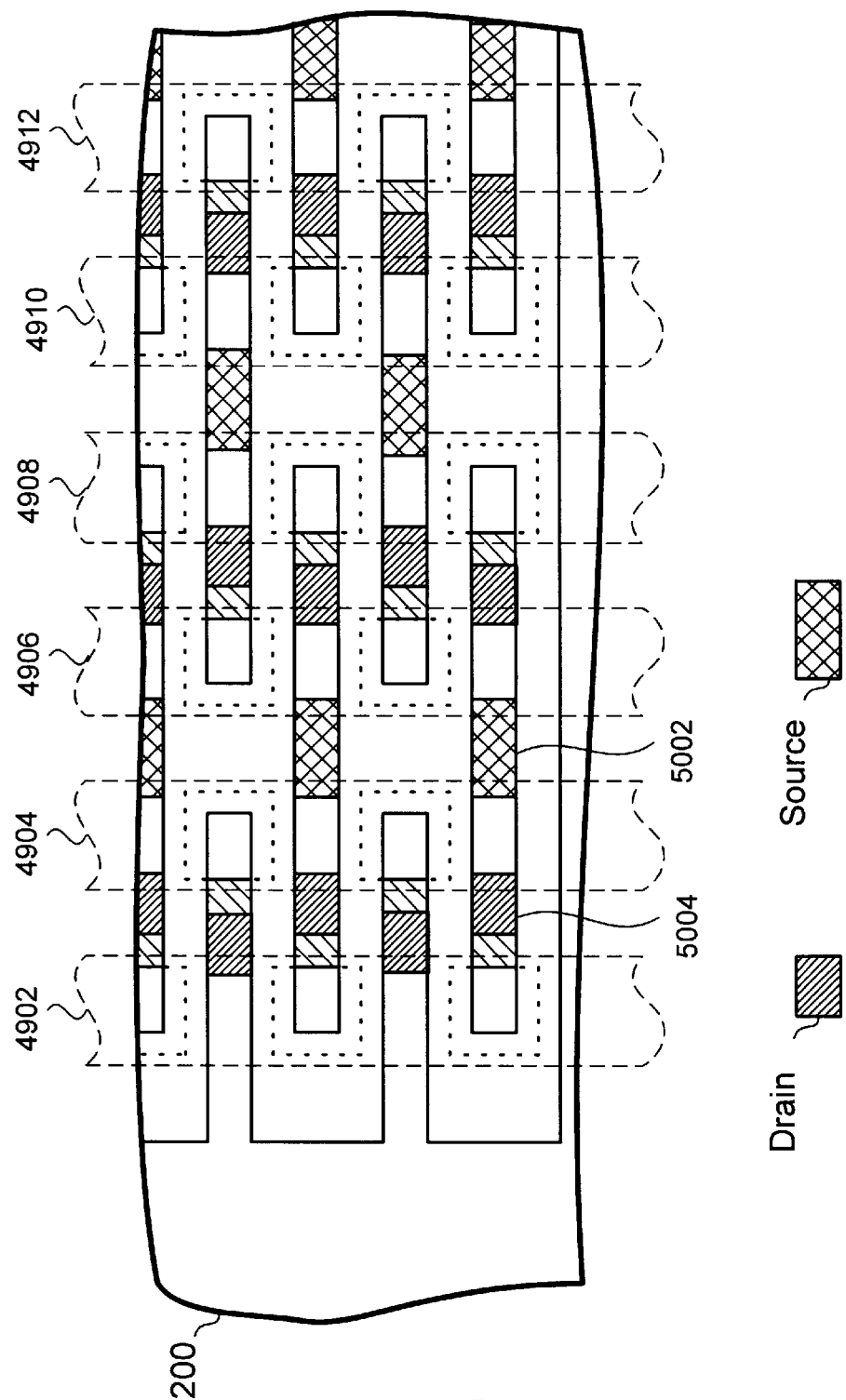

Turning to FIG. 50, the wafer portion 4200 is illustrated with the source regions 5002 and the drain regions 5004 implanted.

The next step 512 is to form the bit line contacts and the bit lines themselves. In accordance with the preferred embodiment, the bit lines are formed using hybrid resist, thus allowing the bit lines to be formed with sub-critical dimensions. Furthermore, the bit lines are preferably trimmed using the preferred trim process.

The first step is to depositing a layer of dielectric, such as silicon dioxide in which the bit lines will be formed. This dielectric will typically have a thickness of ~9000–12000 Å. On top the silicon dioxide is formed a relatively thin layer of nitride.

Figure 51:
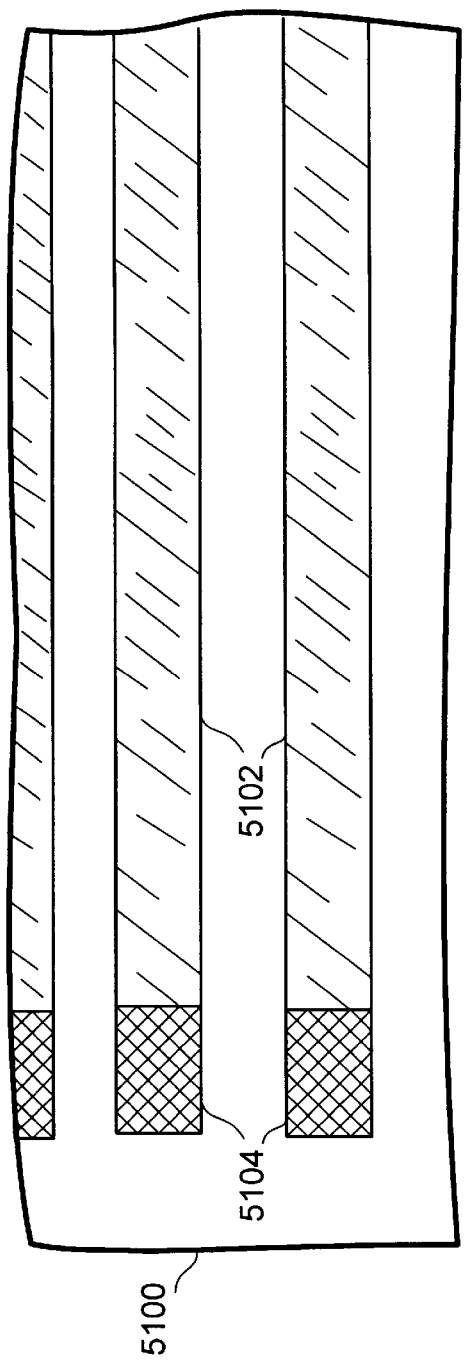

Hybrid resist is deposited, exposed though a mask and developed, forming openings at the edges of the mask shapes. Turning to FIG. 51 an exemplary mask portion 5100 is illustrated. The mask includes a plurality of blocking shapes 5102, each having an grey scale end portions 5104. Again, the grey scale portions 5104 will be used to "trim" the linking features that would otherwise cause shorting between the bit lines formed by the hybrid resist process.

Figure 52:
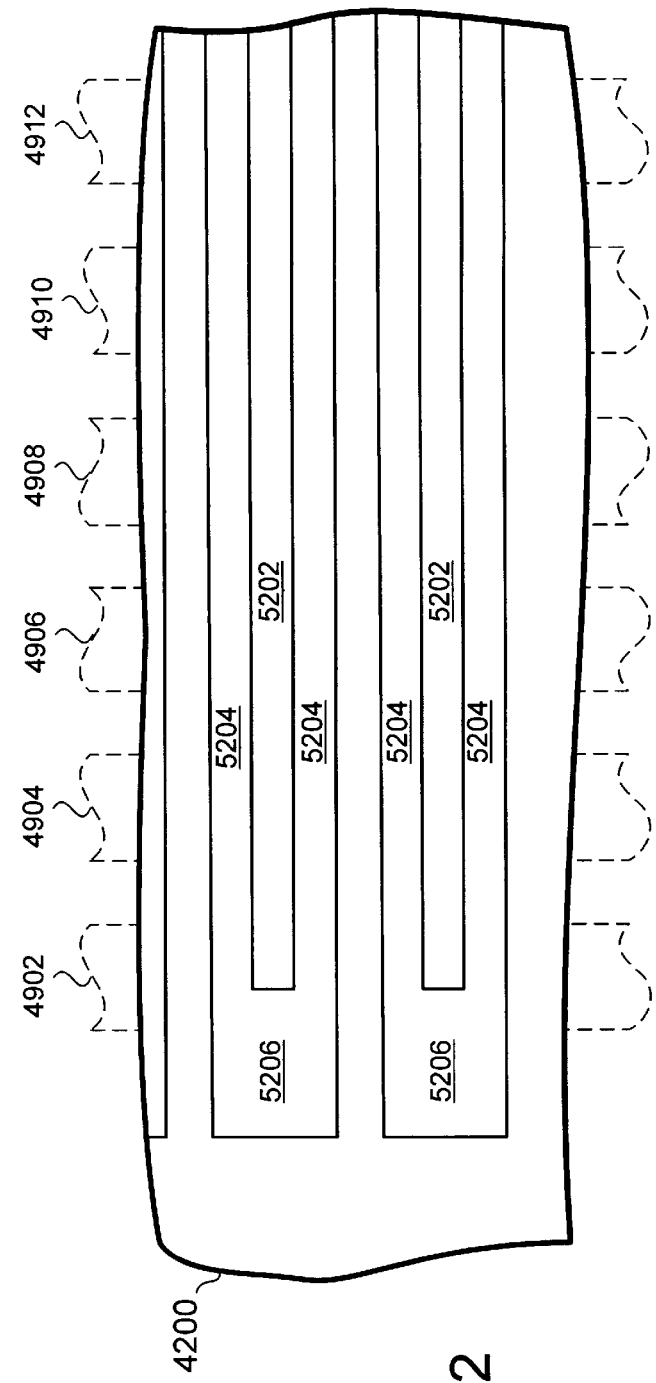

Turning to FIG. 52, the wafer portion 4200 is illustrated with hybrid resist that has been deposited, exposed through the mask 5100 and developed. Hybrid resist portions which are unexposed (i.e., the regions 5202 blocked by mask shapes 5102) remain insoluble in the developer and form positive tone line patterns. Hybrid resist portions which are exposed with high intensity radiation (i.e., the outside regions not blocked by mask shapes 5102) form a negative tone line image. Hybrid resist portions which are exposed with intermediate amounts of intensity (i.e., the areas inside the edges of blocking mask shapes 5102 and the areas under grey-scale mask portions 5104) are dissolved during the development step. This forms the feature spaces 5204 in the resist around the edges of the blocking mask shapes 5102, and forms a trim spaces 5206 in the hybrid resist under the grey-scale mask shapes 5104.

Again, the feature spaces 5204 preferably take advantage of the hybrid resist properties to have a sub-critical width dimension. Conversely, the trim spaces 5206 have proportionally larger dimensions, wide enough such that a gap is formed in the spaces between the "sidewalls" of feature material.

Next, the nitride and dioxide under the hybrid resist is etched through the features spaces 5204 and the trim spaces 5206. This forms troughs in the dielectric in which the bit lines will be formed. The depth of the etching into the dioxide determines the depth of the bit lines, which will be formed in the trench. Preferably, this is a directional etch is stopped when the feature spaces 5204 extend approximately halfway through the dioxide.

Next, the remaining hybrid resist is stripped New resist is then deposited and patterned using a bit line contact mask. This produces openings in the resist over where the interconnects between the bit line and the DRAM are to be formed. Next, the oxide is etched selective to resist and silicon nitride (i.e., both the resist and the nitride serve as a mask) until the underlying silicon is exposed. This forms contact troughs in the dielectric to the underlying silicon. Because this process uses normal resist, the openings in the resist are wider than the bit line openings which were formed using hybrid resist. But, because the nitride remains where it was not etched before, the bit line interconnects will only be formed the width of the feature spaces 5204.

Figure 53:
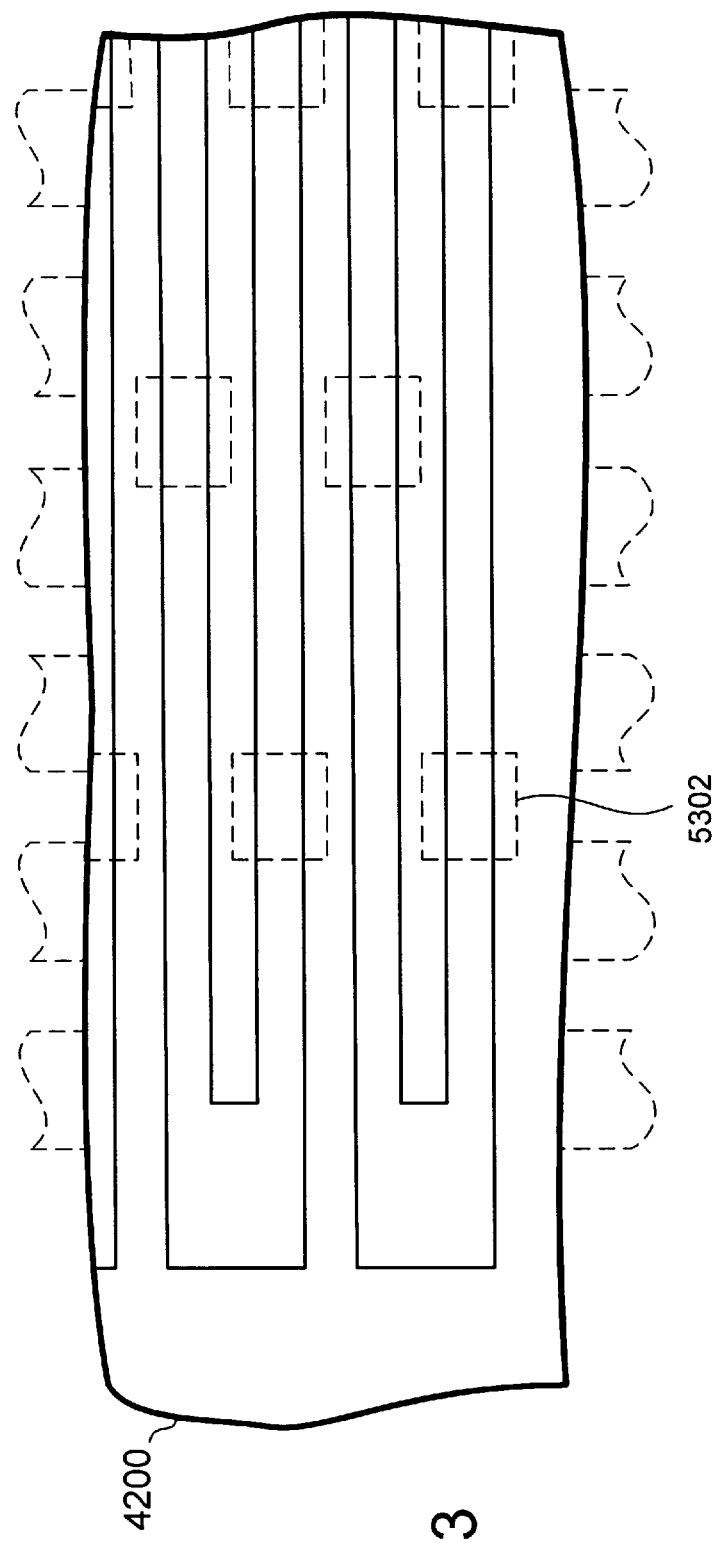
Figure 54:
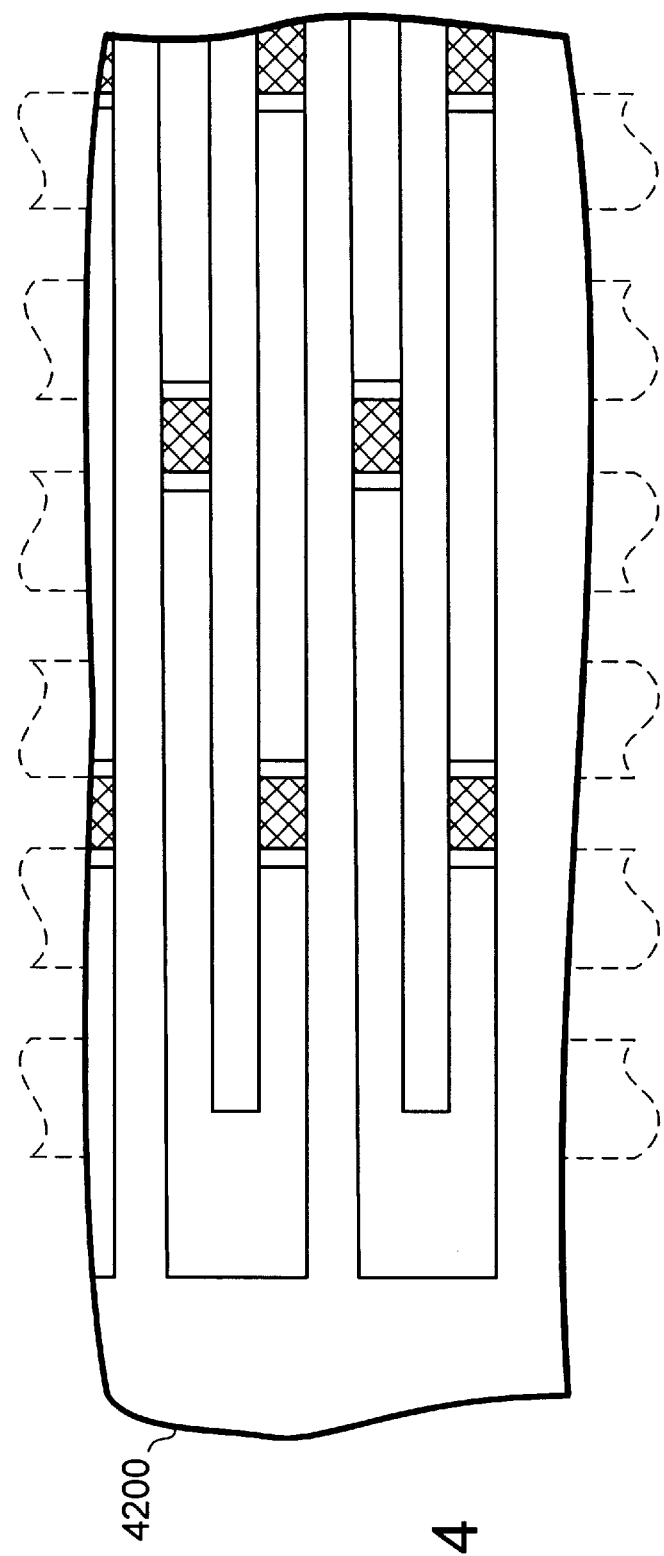

Turning to FIG. 53, the wafer portion is illustrated with the areas where resist is removed to from the bit line contacts are formed using normal resist. This regions are illustrated by dotted lines 5302. As can be seen, because these openings are formed using normal resist, they are wider than the bit line openings formed in the hybrid resist. By etching selective to the nitride however (which remains where it was not etched during the hybrid process), the interconnect opening down to the bit line contact is formed with the same sub-critical dimensions as the bit lines themselves. Thus, the bit line contacts are exposed through the oxide and nitride, as illustrated in FIG. 54.

Figure 55:
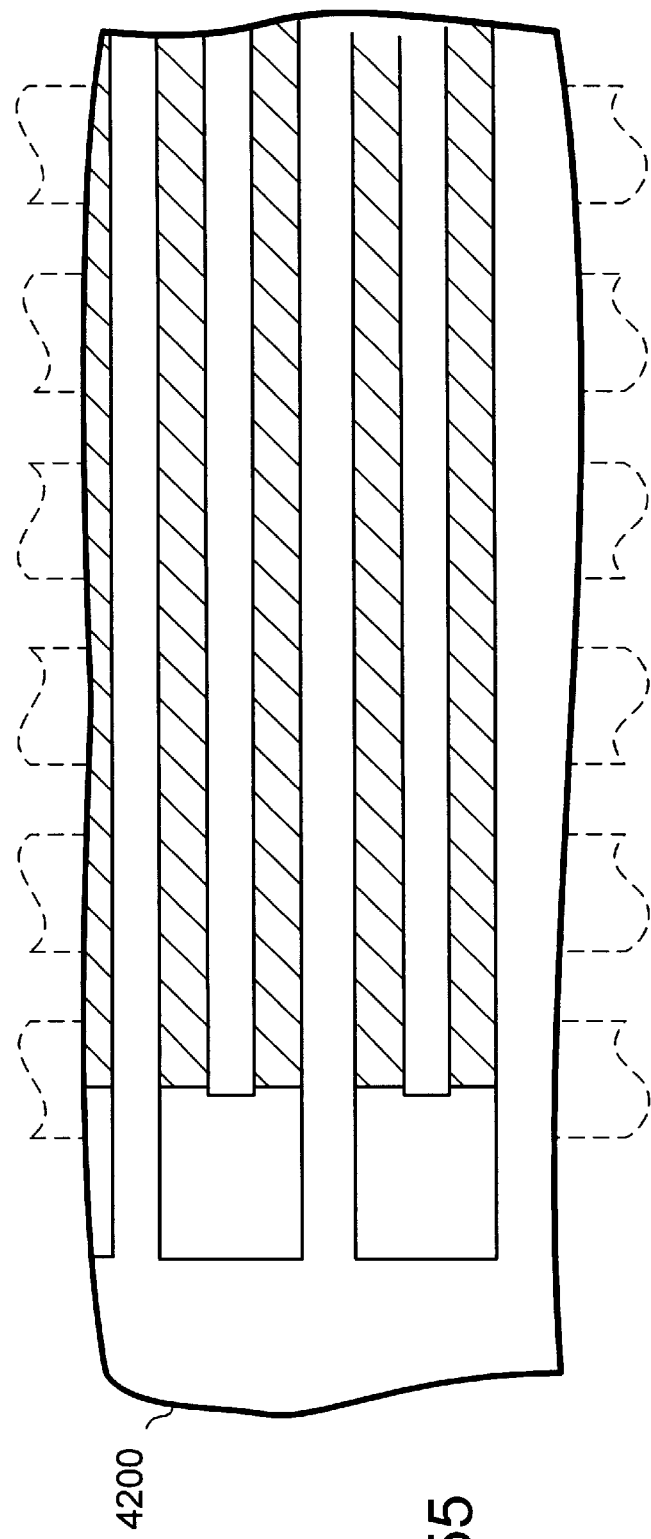

The next step is to deposit the bit line material into the spaces formed in the oxide. Suitably a liner material, to isolate conductor from silicon is deposited, followed by a conformal deposition of a conducting feature material such as aluminum copper silicon; copper, or tungsten. The deposition fills the spaces in the oxide with conductive material, forming the bit lines. In accordance with the preferred trim processes, the next step is to isotropically etch the feature material until all the feature material is removed from the trim spaces in the oxide. Turning to FIG. 55, this results in completed bit lines 5502 as illustrated. Thus, the preferred method is able to use hybrid resist to form bit lines with a sub-critical width.

The preferred method for forming DRAM devices thus results in smaller DRAM cells, and thus a greater density of DRAM cells, by using hybrid resist to form STI regions and bit lines with a sub-critical dimensions.

While the invention has been particularly shown and described with reference to an exemplary embodiment using hybrid resist and the preferred trim process to form MINT DRAM cells, those skilled in the art will recognized that the preferred trim process can be used to form any type of unlinked feature using hybrid resist, and that various changes in form and details may be made therein without departing from the spirit and scope of the invention. For example, it will also be understood by those skilled in the art that the invention is applicable to different isolation technologies (e.g., LOCOS, recessed oxide (ROX), STI, etc.), well and substrate technologies, dopant types, energies and species. It will also be understood that the spirit of the invention is applicable to other silicon-based technologies (e.g., BiCMOS, bipolar, silicon on insulator (SOI), silicon germanium (SiGe).

What is claimed is:

1. A method for forming a dynamic random access memory (DRAM) device comprising the steps of:

a) depositing a first layer of hybrid resist on a semiconductor substrate;

b) exposing said first layer hybrid resist to actinic energy through a mask having a plurality of shapes defining isolation regions such that areas of said first layer of hybrid resist under edges of said isolation region defining shapes are exposed to intermediate amounts of exposure;

c) developing said first layer of hybrid resist, such that areas of said first layer of hybrid resist exposed to intermediate amounts of exposure are developed away;

d) forming shallow trench isolation through said first layer of hybrid resist, the shallow trench isolation formed to isolate DRAM cells formed on the semiconductor substrate;

e) depositing a dielectric layer;

f) depositing a second layer of hybrid resist on said dielectric layer;

g) exposing said second layer of hybrid resist to actinic energy through a mask having a plurality of shapes defining bit line regions such that areas of said second layer of hybrid resist under edges of said bit line defining shapes are exposed to intermediate amounts of exposure;

h) exposing said second layer of hybrid resist to actinic energy through a mask having a plurality of shapes defining trim regions;

i) developing said second layer of hybrid resist;

j) etching through said developed second layer of hybrid resist into said dielectric layers;

k) conformally depositing a bit line material; and l) isotropically etching said bit line material such that said bit line material in said trim regions is removed, said removal leaving formed bit lines to connect the DRAM cells formed on the semiconductor substrate.

2. The method of claim 1 wherein the step of exposing said second layer of hybrid resist to actinic energy through a mask having a plurality of shapes defining bit line regions and the step of exposing said second layer of hybrid resist to actinic energy through a mask having a plurality of shapes defining trim regions comprise exposing said second layer of hybrid resist to actinic energy through a mask containing blocking shapes defining bit lines and grey-scale shapes defining trim regions.

3. The method of claim 1 wherein the step of exposing said second layer of hybrid resist to actinic energy through a mask having a plurality of shapes defining bit line regions and the step of exposing said second layer of hybrid resist to actinic energy through a mask having a plurality of shapes defining trim regions comprise exposing said second layer of hybrid resist to actinic energy through a first mask containing blocking shapes defining bit lines and exposing to actinic energy at intermediate exposure through a second mask containing non-blocking shapes defining trim regions.

4. The method of claim 1 wherein the step of exposing said second layer of hybrid resist to actinic energy through a mask having a plurality of shapes defining bit line regions and the step of exposing said second layer of hybrid resist to actinic energy through a mask having a plurality of shapes defining trim regions comprise exposing said second layer of hybrid resist to actinic energy through a first mask containing blocking shapes defining bit lines, performing a post-exposure bake, and exposing to actinic energy through a second mask containing non-blocking shapes defining trim regions.

* * * * *